(12) United States Patent
Yamashita

(10) Patent No.: US 8,093,645 B2
(45) Date of Patent: Jan. 10, 2012

(54) NON-VOLATILE SEMICONDUCTOR MEMORY DEVICE

(75) Inventor: Yukihiro Yamashita, Niigata (JP)

(73) Assignee: Panasonic Corporation, Osaka (JP)

( * ) Notice: Subject to any disclaimer, the term of this patent is extended or adjusted under 35 U.S.C. 154(b) by 179 days.

(21) Appl. No.: 12/715,916

(22) Filed: Mar. 2, 2010

(65) Prior Publication Data

US 2010/0230742 A1    Sep. 16, 2010

(30) Foreign Application Priority Data

Mar. 10, 2009    (JP) .................................. 2009-056872

(51) Int. Cl.
*H01L 29/76* (2006.01)
(52) U.S. Cl. .. 257/314; 257/508; 257/907; 257/E27.103
(58) Field of Classification Search .................. 257/314, 257/315, 316, 324, 508, 907, E27.103
See application file for complete search history.

(56) References Cited

U.S. PATENT DOCUMENTS

| | | | |
|---|---|---|---|
| 6,774,432 B1 | 8/2004 | Ngo et al. | |
| 6,828,625 B2 | 12/2004 | Bloom et al. | |
| 6,849,504 B2 | 2/2005 | Chang et al. | |
| 7,262,456 B2 * | 8/2007 | Kakoschke et al. | 257/315 |
| 2006/0208281 A1 | 9/2006 | Shappir | |
| 2007/0108509 A1 | 5/2007 | Hashidzume et al. | |
| 2009/0011576 A1 | 1/2009 | Roizin et al. | |
| 2009/0014779 A1 | 1/2009 | Kawashima et al. | |

FOREIGN PATENT DOCUMENTS

JP    2003-243545    8/2003

* cited by examiner

*Primary Examiner* — Hoai V Pham
(74) *Attorney, Agent, or Firm* — McDermott Will & Emery LLP

(57) ABSTRACT

A non-volatile semiconductor memory device includes a plurality of memory cell regions including a plurality of bit lines, a plurality of word lines intersecting the plurality of bit lines, and a first insulating film formed in a region between any two adjacent bit lines, a bit line contact region including bit line contacts connected to the plurality of bit lines, a first UV light shielding film covering at least a portion of the semiconductor substrate in the bit line contact region, an interlayer insulating film, and a second UV light shielding film covering the plurality of memory cell regions. The first UV light shielding film effectively reduces or blocks UV light generated during a fabrication step.

15 Claims, 14 Drawing Sheets

NON-VOLATILE SEMICONDUCTOR MEMORY DEVICE

CROSS-REFERENCE TO RELATED APPLICATION

This application claims priority from Japanese Patent Application No. 2009-056872 filed on Mar. 10, 2009, the disclosure of which application is hereby incorporated by reference into this application in its entirety for all purposes.

BACKGROUND

The technology disclosed herein relates to non-volatile semiconductor memory devices including a gate insulating film having a trap level which can accumulate electric charge, and more particularly, to non-volatile semiconductor memory devices including an ultra-violet (UV) light shielding film.

There are known non-volatile semiconductor devices which store information using an insulating film which can trap electric charge. An example of the non-volatile semiconductor devices includes a gate insulating film including a silicon nitride film having a trap level, a source region, and a drain region. In this non-volatile semiconductor device, hot electrons generated in the drain edge are injected into an oxide nitride oxide (ONO) film in the vicinity of the drain so that electrons are accumulated in the silicon nitride film, whereby information is stored.

In a method for fabricating the non-volatile semiconductor memory device, after a memory cell array is formed, an interlayer insulating film is formed, and metal wirings which serve as electrodes for operating memory cells are formed. In this case, a plasma process of generating UV is used after formation of the memory cell array.

For example, plasma etching is used to create contact holes, and UV light is generated in the plasma etching process. If the generated UV light enters the semiconductor substrate, electrons may be excited and then trapped in the ONO film to increase the threshold (Vt) of the memory cell.

As described above, data is written to the MONOS memory cell by injecting electrons into the ONO film. In this case, if excited electrons generated by UV light are injected into the ONO film, the overall amount of electrons injected thereinto becomes excessive. Therefore, the threshold Vt becomes higher than a value which is previously set to a level required for write operation. In particular, data stored in the memory cell is erased by injecting holes generated by a band-to-band tunneling (BTBT) current into the ONO film to neutralize electrons trapped in the ONO film. Therefore, if Vt is increased, excited electrons trapped in the ONO film cannot be completely neutralized. As a result, the memory cell cannot be lowered to Vt which is previously set to an erase level, which is a problem.

If, for the reason described above, excited electrons generated by UV light are trapped in the ONO film, it is significantly difficult to regulate Vt for write operation and erase operation of the memory cell, leading to a reduction in reliability of the memory cell.

In order to overcome this problem, it is known that a UV light shielding film is provided to cover at least the memory cell region so that UV light which is generated in a wiring fabricating step and then enters the memory cell region is reduced or prevented.

FIG. 23 is a plan view showing a layout of a conventional non-volatile semiconductor memory device. FIG. 24 is a cross-sectional view of the non-volatile semiconductor memory device, taken along line XXIV-XXIV of FIG. 23.

As shown in FIGS. 23 and 24, the conventional non-volatile semiconductor memory device includes a memory cell array (memory cell region) in which a plurality of bit lines 101 and a plurality of word lines 102 orthogonally intersecting the bit lines 101 are provided. The bit lines 101 are formed by introducing an n-type impurity into an upper portion of a p-type well region 143 on a semiconductor substrate 141. The bit lines 101 and the word lines 102 are electrically separated from each other by a bit line oxide film 110.

An ONO film (not shown) is provided in a region between a well region 143 and the word lines 102, which is located between adjacent bit lines 101 as viewed from the top. Therefore, each memory cell has a constitution similar to that of a MOS transistor in which the gate insulating film is replaced with the ONO film. In this non-volatile semiconductor memory device, data is written or erased by selecting an appropriate bit line 101 and word line 102 from the plurality of bit lines 101 and the plurality of word lines 102.

The word lines 102 are covered with an insulating film 150. A first interlayer insulating film 120 is provided on the insulating film 150 and the well region 143. A UV light shielding film 121 is provided on the first interlayer insulating film 120. A second interlayer insulating film 122 is provided on the UV light shielding film 121 and the first interlayer insulating film 120.

As shown in FIG. 23, the UV light shielding film 121 covers an entirety of the memory cell region. As a result, it is difficult for UV light generated in the process of forming wirings 200 to enter the semiconductor substrate, the ONO film and the like in the memory cell region. Note that, in FIG. 23, lines inside the UV light shielding film 121 indicate active regions 170 which are portions of the semiconductor substrate. Other active regions 170 are provided in regions surrounding bit line contacts 130 as viewed from the top. The active regions are electrically separated from each other by isolation regions.

SUMMARY

However, the UV light shielding film 121 is made of a conductive material, such as amorphous silicon, tungsten or the like, and therefore, if a bit line contact 130 contacts the UV light shielding film 121, bit lines are likely to be short-circuited via the UV light shielding film 121. Therefore, a predetermined margin needs to be provided between the UV light shielding film 121 and the bit line contacts 130 to reduce or prevent overlapping between them. Therefore, a periphery of a bit line contact region 103 cannot be covered with the UV light shielding film 121, and therefore, the UV light shielding film 121 has a large opening region on the bit line contact region 103.

UV light enters the memory cell region through the opening portion of the UV light shielding film 121 in, for example, a plasma etching process which is performed when contact holes for the bit line contacts 130 are formed. In this case, electrons excited by the UV light are trapped by the ONO film in the memory cell. As a result, the threshold voltage (Vt) of the memory cell is increased.

FIG. 25 is a diagram showing a relationship between the positions of word lines as viewed from a bit line contact 130 and the threshold voltages (Vt) of memory cells in a bit line direction (a direction in which bit lines are extended). The horizontal axis (X-axis) indicates the word line numbers of memory cells. The left end of the X-axis represents an outermost word line (excluding DWL) in the memory cell array. As the word line number increases, the word line is located closer to the middle of the memory cell array. The vertical axis (Y-axis) indicates ΔVt (a difference between Vt values) of each of the word line numbers of memory cells arranged in the bit line direction, on a logarithmic scale. In this case, ΔVt is a difference between the threshold of a memory cell located closest to the middle of the memory cell array and the threshold of a memory cell located at each position.

As can be seen from the data, the difference of Vt was as small as 1 mV or less in a middle portion (word line numbers 2-15) of the memory cell array, which the present inventor considered that was within a measurement error range. On the other hand, a significant increase in Vt was found for two word lines (word line numbers 0 and 1) inside the memory cell region closest to a dummy word line (DWL) which is located close to the bit line contact region 103. The present inventor considered that this was because UV light generated in a plasma process during fabrication enters through the opening portion of the UV light shielding film 121, and exited electrons are trapped in the ONO film of memory cells located on the two word lines inside the memory cell array closest to the bit line contact region 103, resulting in an increase in Vt. The present inventor inferred on their own that this causes variations in Vt in the memory cell array, which disadvantageously degrade write and erase characteristics of non-volatile semiconductor memory devices.

The detailed description describes implementations of non-volatile semiconductor memory devices in which UV light entering the memory cell region during fabrication is reduced, whereby local variations in characteristics of memory cells can be reduced.

An example non-volatile semiconductor memory device according to the present disclosure includes a memory cell region including a plurality of bit lines formed of a diffusion layer formed in an upper portion of a semiconductor substrate, and spaced from each other and extending in a column direction, a plurality of word lines formed on the semiconductor substrate, and spaced from each other and extending in a row direction, and intersecting the plurality of bit lines, and a first insulating film interposed between the semiconductor substrate and each of the plurality of word lines and located in a region between any two adjacent ones of the plurality of bit lines, and having a function of holding electric charge, a bit line contact region including bit line contacts connected to the plurality of bit lines extended from the memory cell region, and a bit line isolation portion electrically separating the plurality of bit lines from each other, a first UV light shielding film formed on the semiconductor substrate and covering at least a portion of the bit line isolation portion or a portion of the semiconductor substrate in the bit line contact region, an interlayer insulating film provided on the word lines and the first UV light shielding film, and a second UV light shielding film formed on the interlayer insulating film and covering the semiconductor substrate in the memory cell region.

In the memory cell region, a plurality of memory cells are provided, each of which has a source region and a drain region which are regions where the corresponding two bit lines intersect the corresponding word line, a gate insulating film which is the first insulating film interposed between the source region and the drain region, and a gate electrode which is a portion formed on a region of the corresponding word line located on the gate insulating film.

With this configuration, even if UV light enters through the opening portion of the second UV light shielding film provided on the bit line contact region, the first light shielding film formed on the bit line contact region reduces or blocks the UV light, whereby UV light entering the memory cell region can be effectively reduced or blocked. Therefore, excited electrons generated in the memory cell region by UV light can be reduced, and therefore, local variations in the threshold of the memory cell in the memory cell region can be reduced. As a result, a non-volatile semiconductor memory device which has small variations in the threshold and high reliability can be achieved.

When the bit line isolation portion is an STI region formed in the semiconductor substrate between each of the plurality of bit lines, the first UV light shielding film may be formed on at least the STI region.

The first UV light shielding film may have the same constitution as that of the gate electrode.

A second insulating film having the same constitution as that of the first insulating film may be further provided in the bit line contact region. In the bit line contact region, the first UV light shielding film may be formed on the STI region with the second insulating film being interposed therebetween.

Alternatively, the first UV light shielding film may have the same constitution as that of the gate electrode.

The first UV light shielding film may have the same constitution as that of the gate electrode. In the bit line contact region, a second insulating film having the same constitution as that of the first insulating film may be further provided below the first UV light shielding film. The bit line isolation portion may have a gate isolation structure including the first UV light shielding film and the second insulating film.

In a portion of the memory cell region close to the bit line contact region, a dummy word line having substantially the same constitution as that of the word line may be provided, extending in the row direction and intersecting the plurality of bit lines. The first UV light shielding film may be electrically connected to the dummy word line.

The first UV light shielding film and the dummy word line may be connected to a ground potential.

The first UV light shielding film may cover at least a portion of a region between each of the plurality of bit lines and at least a portion of each of the bit lines, in the bit line contact region.

The non-volatile semiconductor memory device may further include a bit line oxide film formed on the plurality of bit lines and electrically separating the bit lines from the word lines. The first UV light shielding film may cover at least a terminal portion of the bit line oxide film.

The first UV light shielding film may be a polycrystal silicon film.

The first UV light shielding film may be a multilayer film including a polycrystal silicon film and a silicide film formed on the polycrystal silicon film.

The first UV light shielding film may be a multilayer film including a polycrystal silicon film and a metal film formed on the polycrystal silicon film.

The non-volatile semiconductor memory device may further include a liner film covering at least a portion of the first UV light shielding film, formed below the interlayer insulating film, and having etching selectivity with respect to the interlayer insulating film.

The bit line contacts may penetrate through the liner film to be connected to the respective bit lines. The bit line contacts may be formed in a self-aligned manner by the liner film.

The liner film may be a silicon nitride film.

As described above, according to the example non-volatile semiconductor memory device of the present disclosure, even if UV light enters through the opening portion of the second UV light shielding film provided on the bit line contact region, the first light shielding film formed on the bit line contact region reduces or blocks the UV light, whereby UV light entering the gate insulating film, the semiconductor substrate and the like in the memory cell region can be effectively reduced or blocked. Therefore, excited electrons generated in the memory cell region by UV light can be reduced, and therefore, local variations in the threshold of the memory cell in the memory cell region can be reduced. As a result, a non-volatile semiconductor memory device which has small variations in the threshold and high reliability can be achieved.

DETAILED DESCRIPTION

Non-volatile semiconductor memory devices according to embodiments of the present disclosure will be described hereinafter with reference to the accompanying drawings. It will be understood that the embodiments described below are only for illustrative purposes and are not intended to limit the scope of the present disclosure, and various modifications and changes can be made thereto without departing from the spirit and scope of the present disclosure.

First Embodiment

Configuration of Non-Volatile Semiconductor Storage Device

Figure 1:
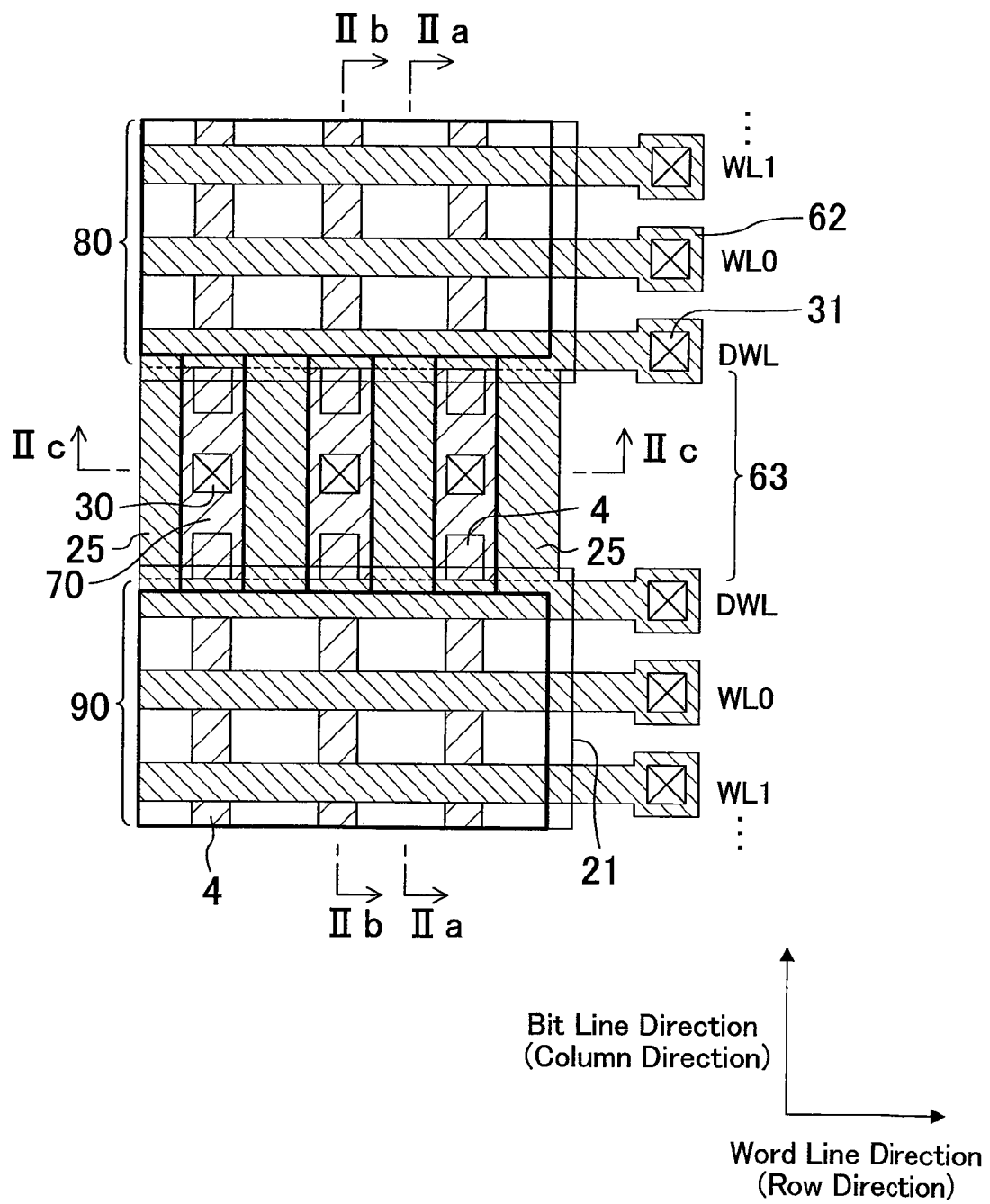
FIG. 1 is a plan view showing a layout of a non-volatile semiconductor memory device according to a first embodiment of the present disclosure.
Figure 2A:
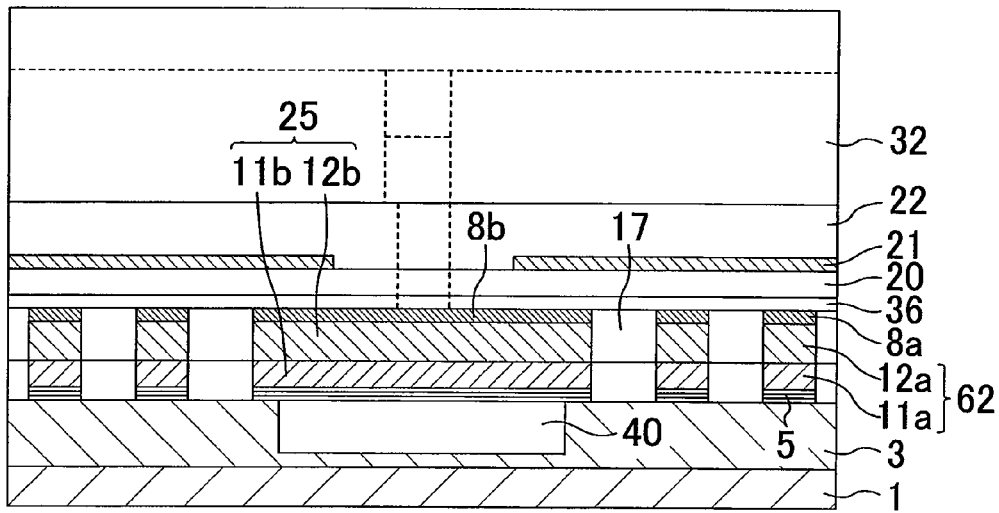
FIGS. 2A, 2B and 2C are cross-sectional views of the non-volatile semiconductor memory device of the first embodiment, taken along lines IIa-IIa, IIb-IIb and IIc-IIc of FIG. 1, respectively.
Figure 2B:
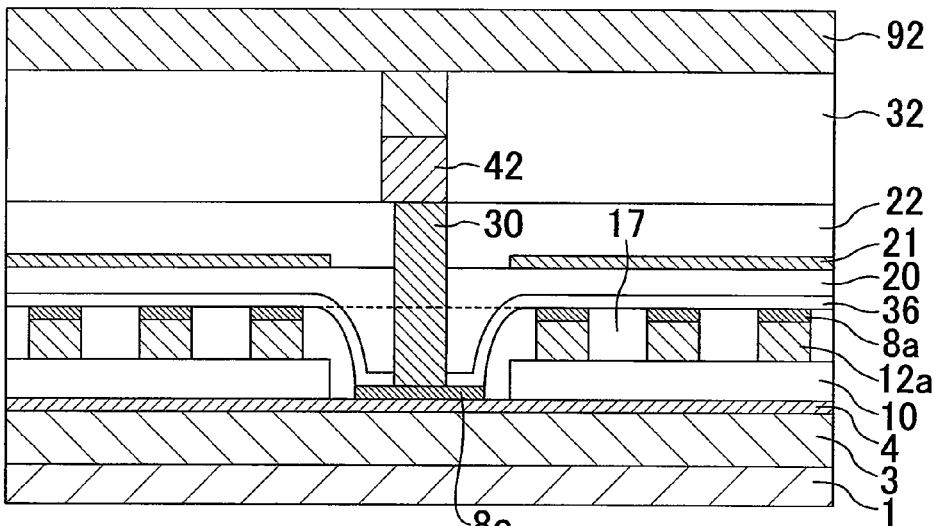
Figure 2C:
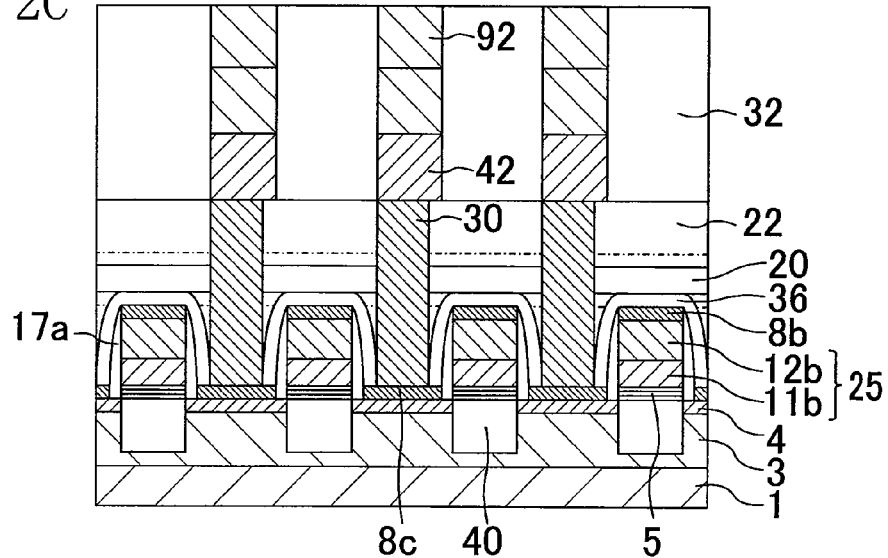

FIG. 1 is a plan view showing a layout of a non-volatile semiconductor memory device according to a first embodiment of the present disclosure. FIGS. 2A, 2B and 2C are cross-sectional views of the non-volatile semiconductor memory device, taken along lines IIa-IIa, IIb-IIb and IIc-IIc of FIG. 1, respectively.

As shown in FIG. 1, the non-volatile semiconductor memory device of this embodiment has a memory cell region (a region in which a memory cell array is provided) each including a plurality of bit lines (bit line diffusion layer) 4 which are arranged at a predetermined pitch, and a plurality of word lines 62 which are arranged at a predetermined pitch, intersecting (or orthogonally intersecting) the bit lines 4. FIG. 1 shows a first memory cell region 80 and a second memory cell region 90 which are provided adjacent to each other in a bit line direction (column direction), and a bit line contact region 63 which is provided between the first and second memory cell regions 80 and 90. In each of the first and second memory cell regions 80 and 90, the word lines 62 of FIG. 1 are also indicated by WL0, WL1 and so on in order of increasing distance from the bit line contact region 63.

The bit lines 4 are formed in an upper portion of a semiconductor substrate of, for example, a first conductivity type (e.g., p type), and are formed of a diffusion layer of a second conductivity type (e.g., n type). As used herein, the term "semiconductor substrate" refers to a combination of a substrate 1 made of silicon or the like, and a well 3 of the first conductivity type provided on the substrate 1 (see FIG. 2B). The bit lines 4 are extended to the bit line contact region 63, and are electrically connected to respective corresponding bit line contacts 30 in the bit line contact region 63.

The bit lines 4 are extended across and below dummy word lines DWL with ends thereof being close to the bit line contacts 30. An active region 70 is formed in the bit line contact region 63 by implanting an impurity having the same conductivity type as that of the bit lines 4 using an implantation mask which is different from that for the bit lines 4 extended from the memory cell region. The active region 70 in the bit line contact region 63 electrically connects the bit lines 4 to the bit line contacts 30. Note that the active region 70 in the bit line contact region 63 has the same conductivity type as that of the bit lines 4, and functions as portions of bit lines, and therefore, is shown as the bit lines 4 in FIGS. 2B and 2C and the like.

A word line contact 31 is provided at a terminal portion of each word line 62. A dummy word line (DWL) extending in a word line direction is provided on a portion of each memory cell region close to the bit line contact region 63. As used herein, the dummy word line DWL is a line which has the same constitution as that of the word line 62 and does not have an influence on storage operation of the memory cells. In the non-volatile semiconductor memory device of this embodiment, all dummy word lines DWL on the memory cell regions have the same potential, and a connection portion which connects dummy word lines DWL adjacent to each other in the bit line direction is provided on the bit line contact region 63. The connection portion functions as a first UV light shielding film 25 as described below.

As shown in FIGS. 2A-2C, the first and second memory cell regions 80 and 90 and the bit line contact region 63 are formed on the well 3 provided on the first conductivity type substrate 1.

In the bit line contact region 63, any adjacent bit lines 4 are electrically separated from each other by an insulating film (bit line isolation portion) 40 for isolation (e.g., shallow trench isolation (STI), etc.) which is provided on the well 3.

In the first and second memory cell regions 80 and 90, an ONO film (gate insulating film) 5 is provided in a region which is interposed between the semiconductor substrate (well 3) and the word lines 62 and is located between any two bit lines 4. The ONO film 5 is also provided on the isolation insulating film 40 in the bit line contact region 63. The ONO film 5 is formed of a silicon oxide film, a silicon nitride film and a silicon oxide film having a thickness of, for example, about 5 nm, about 5 nm and 10 nm, respectively, which are successively stacked on the top of one another in this stated order.

The word lines 62 and the dummy word lines DWL are each formed of a first polycrystal silicon film 11a provided on the ONO film 5, and a second polycrystal silicon film 12a provided on the first polycrystal silicon film 11a and a bit line oxide film 10. The word lines 62 and the dummy word lines DWL (the second polycrystal silicon film 12a) are electrically separated from the bit lines 4 by the bit line oxide film 10.

The first UV light shielding film 25 is provided to cover the isolation insulating film 40 in the bit line contact region 63. The first UV light shielding film 25 is formed of a first polycrystal silicon film 11b provided on the ONO film 5 (second insulating film) in the bit line contact region 63, and a second polycrystal silicon film 12b. The first polycrystal silicon film 11b and the first polycrystal silicon film 11a have the same thickness, which is, for example, about 50 nm. The second polycrystal silicon film 12b and the second polycrystal silicon film 12a have the same thickness, which is, for example, about 150 nm. Gaps in the second polycrystal silicon film 12a and the second polycrystal silicon film 12b are filled with a tetra ethyl ortho silicate (TEOS) film 17.

A silicide layer 8a is provided on the word lines 62 so as to reduce the resistance the word lines 62. When the first UV light shielding film 25 and the word lines 62 are formed in the same step, the first UV light shielding film 25 has the same constitution as that of the word lines 62, and therefore, a silicide layer 8b is also formed on the first UV light shielding film 25. Moreover, a liner film 36 made of, for example, silicon nitride is provided over the silicide layer 8a and the silicon oxide film (e.g., TEOS film) 17 and over the silicide layer 8b. A first interlayer insulating film 20 is provided on the liner film 36 (over the word lines 62 and the first UV light shielding film 25), covering an entire upper surface of the substrate. A second UV light shielding film 21 is provided on the first interlayer insulating film 20, covering the semiconductor substrate and the ONO film 5 in at least the memory cell region (the first and second memory cell regions 80 and 90). The second UV light shielding film 21 is made of a material which substantially does not transmit UV, such as polycrystal silicon, metal or the like. A second interlayer insulating film 22 is provided on the second UV light shielding film 21 and the first interlayer insulating film 20. A third interlayer insulating film 32 is provided on the second interlayer insulating film 22.

In the bit line contact region 63, a silicide layer 8c is provided on a portion of each bit line 4, and the bit line contacts 30 are provided which penetrate through the first and second interlayer insulating films 20 and 22 and each of which has an end connected to the silicide layer 8c. The other end of each bit line contact 30 is connected to a metal wiring 92 via a metal wiring 42 on the third interlayer insulating film 32.

As described above, according to the non-volatile semiconductor memory device of this embodiment, the second UV light shielding film 21 covers the semiconductor substrate, the ONO film 5 and the like in the memory cell region including the first and second memory cell regions 80 and 90. Therefore, most of UV light generated in the step of forming the metal wirings 92, the step of forming the bit line contacts 30, and the like is blocked by the second UV light shielding film 21, whereby variations in characteristics of the ONO film 5 in the memory cell region can be reduced.

Moreover, according to the non-volatile semiconductor memory device of this embodiment, in the bit line contact region 63, a predetermined margin is provided between the bit line contacts 30 and the first UV light shielding film 25 to reduce or prevent overlapping or contact between the bit line contacts 30 and the first UV light shielding film 25. In this situation, the first UV light shielding film 25 covers at least a portion of the bit line contact region 63. In the example of FIG. 1, the first UV light shielding film 25 covers at least a portion of the isolation insulating film 40, and is provided between any two adjacent bit line contacts 30. With this structure, even when UV light enters through the opening portion of the second UV light shielding film 21 in the bit line contact region 63, the first UV light shielding film 25 provided on the isolation insulating film 40 at peripheries of the bit line contacts 30 reduces or blocks UV light entering from the bit line contact region 63 into the memory cell region. As a result, excited electrons generated in the memory cell region by UV light can be reduced, and therefore, excited electrons trapped by the ONO film 5 in the memory cell can be reduced. As a result, variations in the threshold of each memory cell can be reduced, resulting in a non-volatile semiconductor memory device having improved reliability.

—Operation of Non-Volatile Semiconductor Storage Device—

The non-volatile semiconductor memory device of this embodiment is a so-called metal oxide nitride oxide silicon (MONOS) flash memory. Operation of the device will be briefly described hereinafter.

In the non-volatile semiconductor memory device of this embodiment, each memory cell has a source region and a drain region which are portions where two adjacent bit lines intersect one word line, a gate insulating film which is the ONO film 5 interposed between the source and drain regions, and a gate electrode which is a portion of the word line 62 located on the ONO film 5. In other words, the ONO film 5 is formed in a region which is interposed between the semiconductor substrate and the word lines 62 and is located between any two adjacent bit lines 4, and functions as a gate insulating film having a function of holding electric charge. In this case, in the MONOS flash memory, the ONO film serves as the gate insulating film of each memory cell, and a state in which electrons are accumulated in the silicon nitride film (the ONO film) is defined as "0" and a state in which electrons are not accumulated in the silicon nitride film (the ONO film) is defined as "1."

When data is written to a selected memory cell, a predetermined write voltage (e.g., a high voltage of 9 V) is applied to the word line 62 included in the gate electrode while the substrate and the source region of the selected memory cell are each maintained at 0 V. A pulse potential is applied to the drain region to continue the write operation until a predetermined write level is reached. By this operation, channel hot electrons (CHE) generated in the vicinity of the drain region are trapped by the silicon nitride film in the ONO film 5, so that the threshold voltage (Vt) of the memory cell is increased, whereby "0" is written.

Next, when the data is erased, a predetermined erase voltage (e.g., a negative high voltage of −7 V) is applied to the word line included in the gate electrode of the selected memory cell while the substrate of the memory cell is maintained at 0 V and the source region of the memory cell is maintained in the open state (OPEN). In this state, a pulse potential is applied to the drain region to inject holes into the ONO film 5 until a predetermined erase level is reached. As a result, electrons captured by the ONO film 5 during the write operation are neutralized, so that the threshold voltage (Vt) is lowered to the predetermined erase level, whereby the "1" state is achieved. In this case, holes injected into the ONO film 5 are generated by a BTBT current occurring in the vicinity of a selected bit line 4.

Although a write method in which CHE is utilized has been described above, data may be written using a Fowler Nordheim (FN) tunnel current.

—Method for Fabricating Non-Volatile Semiconductor Storage Device—

Figure 3:
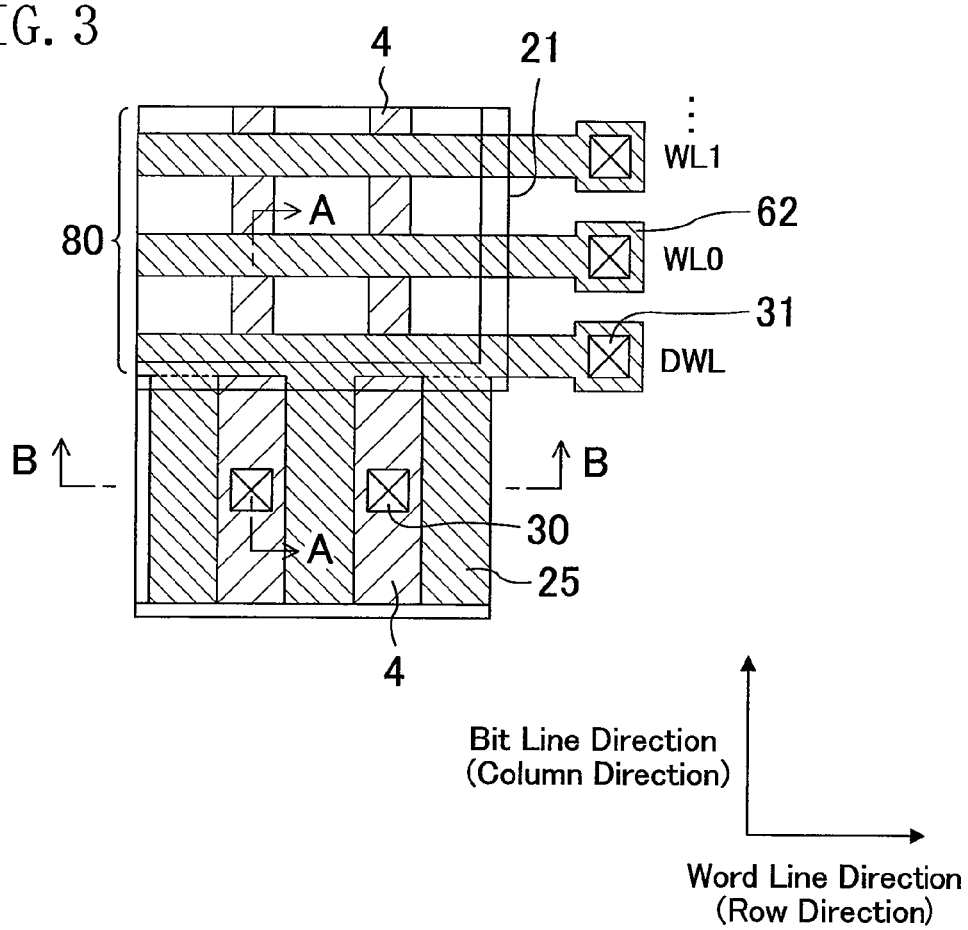
FIG. 3 is a plan view showing a part of the non-volatile semiconductor memory device of the first embodiment.

Next, a method for fabricating the non-volatile semiconductor memory device of this embodiment will be described. FIG. 3 is a plan view showing a part of the non-volatile semiconductor memory device of this embodiment. FIGS. 4-18 are cross-sectional views showing fabrication steps of the non-volatile semiconductor memory device of this embodiment. A portion (a) of each figure is a cross-sectional view taken along line A-A of FIG. 3, and a portion (b) of each figure is a cross-sectional view taken along line B-B of FIG. 3.

Figure 4:
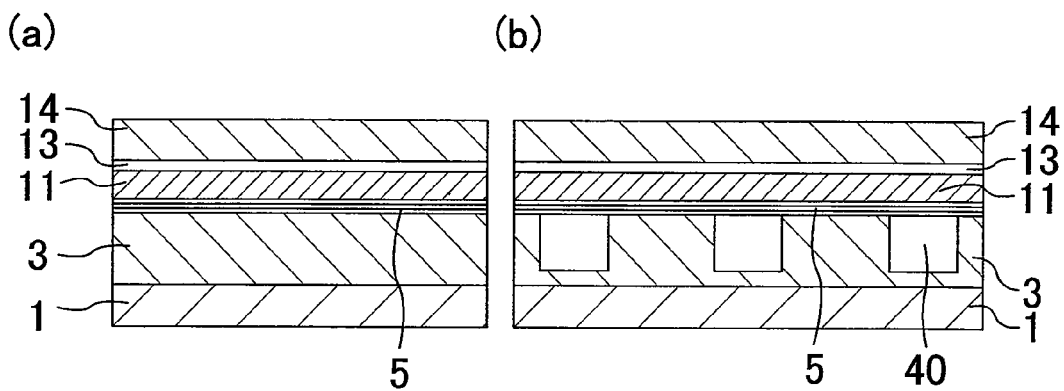
FIG. 4 is a cross-sectional view showing a fabrication step of the non-volatile semiconductor memory device of the first embodiment.

Initially, as shown in (a) and (b) of FIG. 4, the well 3 of the first conductivity type (e.g., p type) is formed on the substrate 1, and thereafter, the isolation insulating film 40 is formed in a predetermined region of an upper portion of the well 3 by a known STI technique. Next, the ONO film 5 is formed on the substrate. Specifically, an upper surface portion of the well 3 is oxidized to form a silicon oxide film having a thickness of, for example, 5 nm. Next, a silicon nitride film having a thickness of 25 nm is formed by low pressure chemical vapor deposition (CVD), and thereafter, an upper surface portion of the silicon nitride film is oxidized to form a silicon oxide film on the silicon nitride film.

Next, a first polycrystal silicon film 11 having a thickness of about 50 nm, a silicon oxide film 13 having a thickness of about 10 nm, and a silicon nitride film 14 having a thickness of about 100 nm are successively formed on the ONO film 5 by low pressure CVD or the like.

Figure 5:
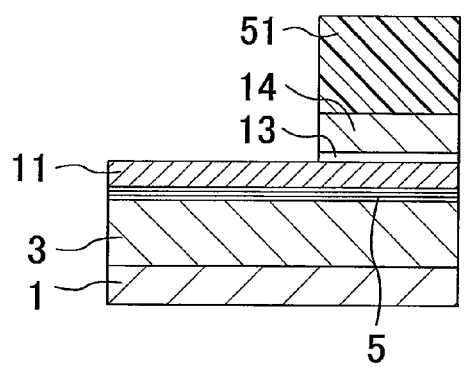
FIG. 5 is a cross-sectional view showing a fabrication step of the non-volatile semiconductor memory device of the first embodiment.
Figure 5:
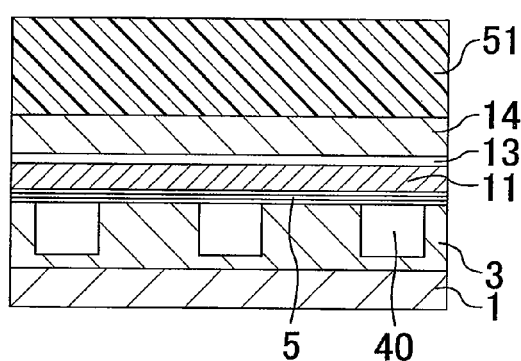

Next, as shown in (a) and (b) of FIG. 5, a resist 51 having a predetermined pattern for forming bit lines is formed on an upper surface of the substrate, and thereafter, the resist 51 is used as a mask to perform, for example, plasma etching with respect to the silicon nitride film 14 and the silicon oxide film 13, whereby a portion of the silicon nitride film 14 and the silicon oxide film 13 is removed.

Figure 6:
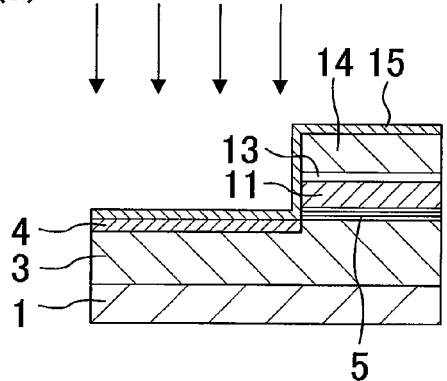
FIG. 6 is a cross-sectional view showing a fabrication step of the non-volatile semiconductor memory device of the first embodiment.
Figure 6:
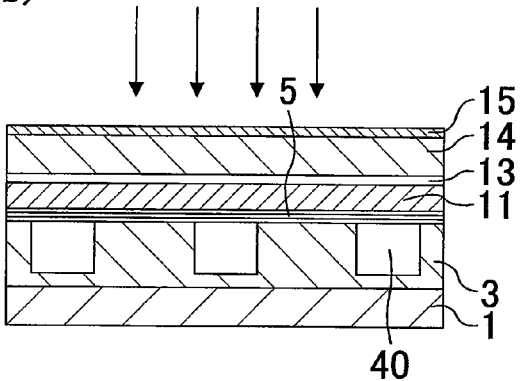

Next, as shown in (a) and (b) of FIG. 6, the resist 51 is removed, and thereafter, the silicon nitride film 14 is used as a mask to perform etching with respect to the first polycrystal silicon film 11 and the ONO film 5, whereby a portion of the first polycrystal silicon film 11 and the ONO film 5 is removed. Thereafter, a silicon oxide film 15 having a thickness of, for example, about 5 nm is formed on an upper surface of the substrate by low pressure CVD or the like. Next, for example, arsenic ions are implanted into a predetermined region of the well 3 through the silicon oxide film 15 at an acceleration energy of 20 KeV and a dose of $5\times10^{15}$ cm$^{-2}$, to form the bit lines 4. The bit lines 4 formed in this step are extended from the memory cell region to a portion of the bit line contact region, but do not reach a region in which the bit line contacts 30 will be formed later.

Figure 7:
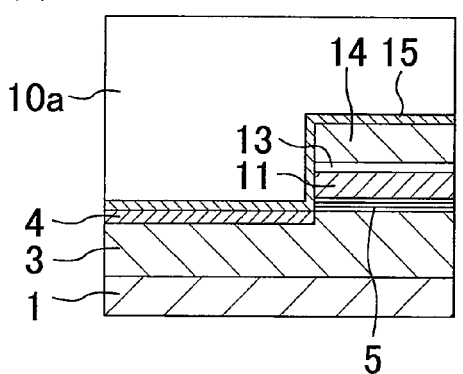
FIG. 7 is a cross-sectional view showing a fabrication step of the non-volatile semiconductor memory device of the first embodiment.
Figure 7:
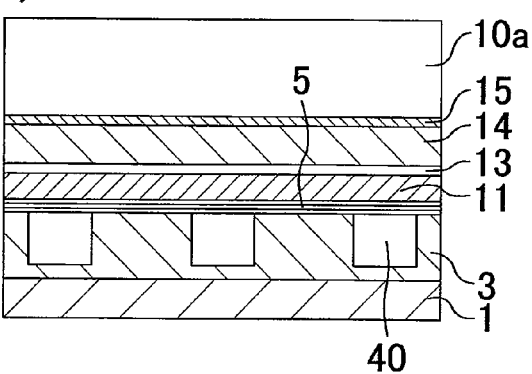
Figure 8:
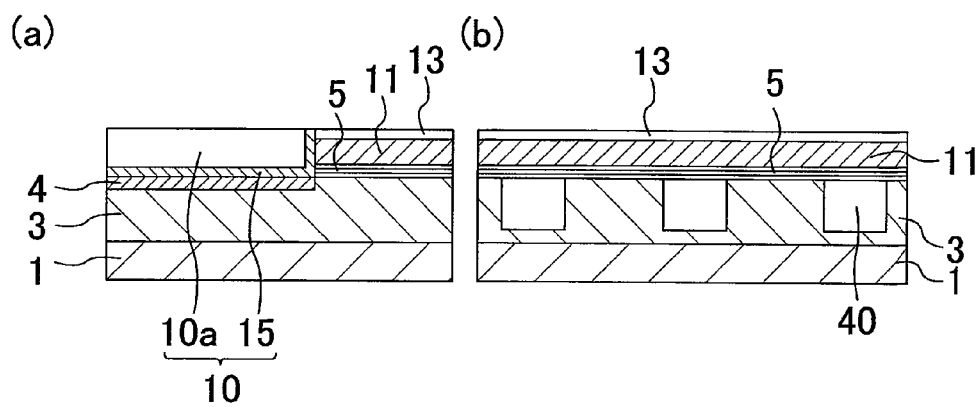
FIG. 8 is a cross-sectional view showing a fabrication step of the non-volatile semiconductor memory device of the first embodiment.

Next, as shown in (a) and (b) of FIG. 7, for example, a high density plasma-nondoped silicate glass (HDP-NSG) film 10*a* having a thickness of 500 nm is formed on an upper surface of the substrate. Next, as shown in (a) and (b) of FIG. 8, an upper surface of the substrate is planarized by polishing the HDP-NSG film 10*a* by chemical mechanical polishing (CMP) until the silicon oxide film 15 is exposed. As a result, the HDP-NSG film 10*a* is formed on the bit lines 4 with the silicon oxide film 15 being interposed therebetween. The HDP-NSG film 10*a* is embedded in gaps in the first polycrystal silicon film 11. The bit line oxide film 10 shown in FIGS. 2A and 2B are formed of the HDP-NSG film 10*a* and the silicon oxide film 15 shown in (a) of FIG. 8. Thereafter, the silicon oxide film 15 and the silicon nitride film 14 are removed.

Figure 9:
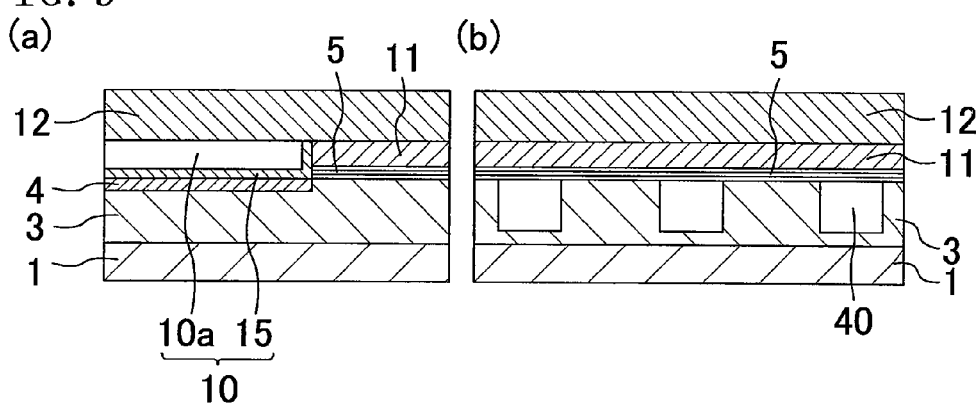
FIG. 9 is a cross-sectional view showing a fabrication step of the non-volatile semiconductor memory device of the first embodiment.

Next, as shown in (a) and (b) of FIG. 9, the silicon oxide film 13 on the first polycrystal silicon film 11 is removed, and thereafter, a second polycrystal silicon film 12 having a thickness of about 150 nm is formed on an upper surface of the substrate by, for example, CVD. As a result, the first and second polycrystal silicon films 11 and 12 directly contact each other.

Figure 10:
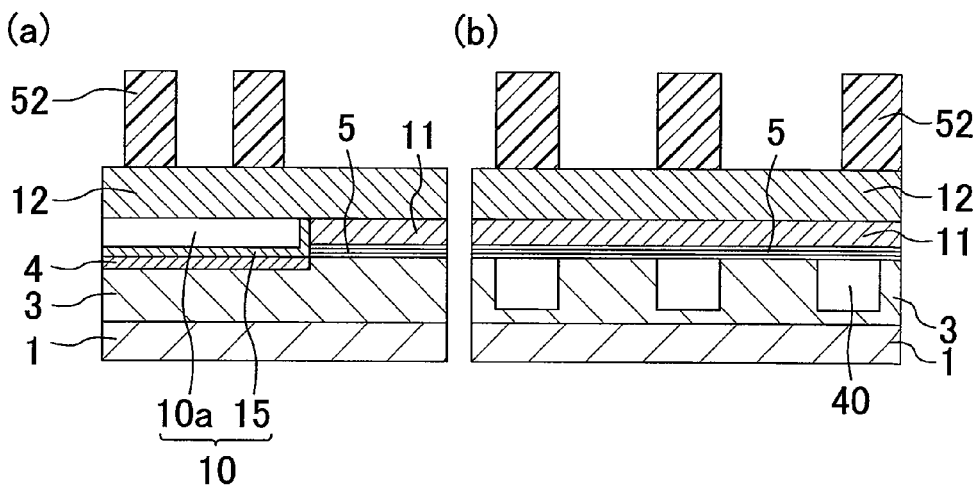
FIG. 10 is a cross-sectional view showing a fabrication step of the non-volatile semiconductor memory device of the first embodiment.

Next, as shown in (a) and (b) of FIG. 10, a resist 52 having a predetermined pattern for forming word lines is formed on the second polycrystal silicon film 12 by lithography.

Figure 11:
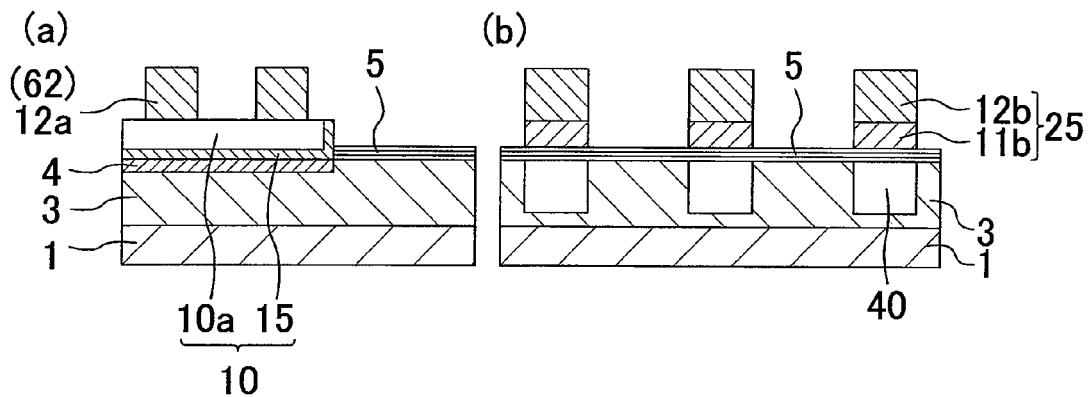
FIG. 11 is a cross-sectional view showing a fabrication step of the non-volatile semiconductor memory device of the first embodiment.

Next, as shown in (a) and (b) of FIG. 11, the resist 52 is used as a mask to perform plasma etching with respect to the first polycrystal silicon film 11. In this case, a portion of the first polycrystal silicon film 11 which is left in the first memory cell region 80 is denoted as the first polycrystal silicon film 11*a* (not shown), and a portion of the first polycrystal silicon film 11 which is left in the bit line contact region is denoted as the first polycrystal silicon film 11b. A portion of the second polycrystal silicon film 12 which is left in the first memory cell region 80 is denoted as the second polycrystal silicon film 12a (not shown), and a portion of the second polycrystal silicon film 12 which is left in the bit line contact region 63 is denoted as the second polycrystal silicon film 12b. By this step, the word lines 62 formed of the first polycrystal silicon film 11a (hidden in (a) of FIG. 10) and the second polycrystal silicon film 12a immediately thereabove, and the first UV light shielding film 25 formed of the first polycrystal silicon film 11b and the second polycrystal silicon film 12b immediately thereabove, are formed. The second polycrystal silicon film 12a is provided on the bit line oxide film 10 at positions where it overlaps the bit lines 4.

Figure 12:
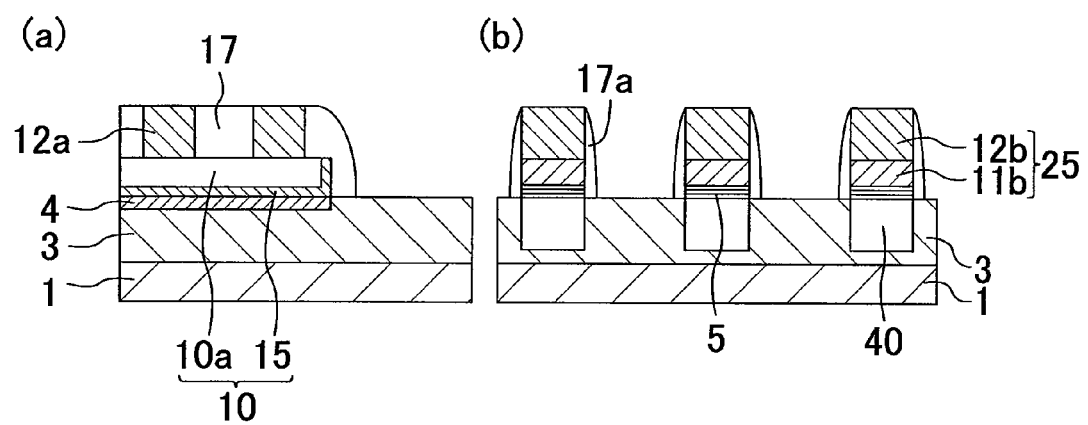
FIG. 12 is a cross-sectional view showing a fabrication step of the non-volatile semiconductor memory device of the first embodiment.

Next, as shown in (a) and (b) of FIG. 12, a TEOS film having a thickness of about 120 nm is formed by, for example, low pressure CVD, and thereafter, the TEOS film is etched back to fill gaps in the second polycrystal silicon film 12a, and form the silicon oxide film (e.g., TEOS film) 17 covering side surfaces of the bit line oxide film 10, and sidewalls 17a provided on side surfaces of the first UV light shielding film 25.

Figure 13:
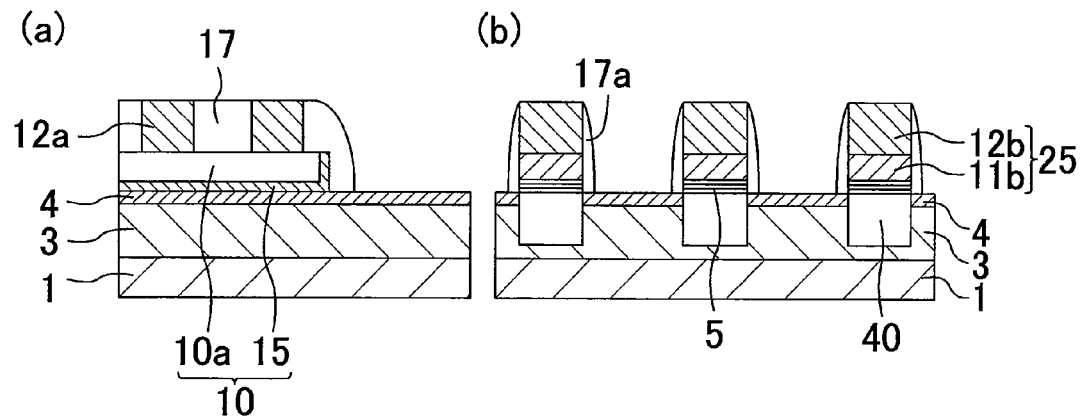
FIG. 13 is a cross-sectional view showing a fabrication step of the non-volatile semiconductor memory device of the first embodiment.

Next, as shown in (a) and (b) of FIG. 13, impurity ions having the same conductivity type as that of the bit lines 4 formed in the step of (a) and (b) of FIG. 6 are implanted into an upper portion of the well 3, to form a contact region for connection to the bit line contacts in the bit line contact region 63. The contact region formed in this step is shown as a portion of each bit line 4 in (a) and (b) of FIG. 13.

Figure 14:
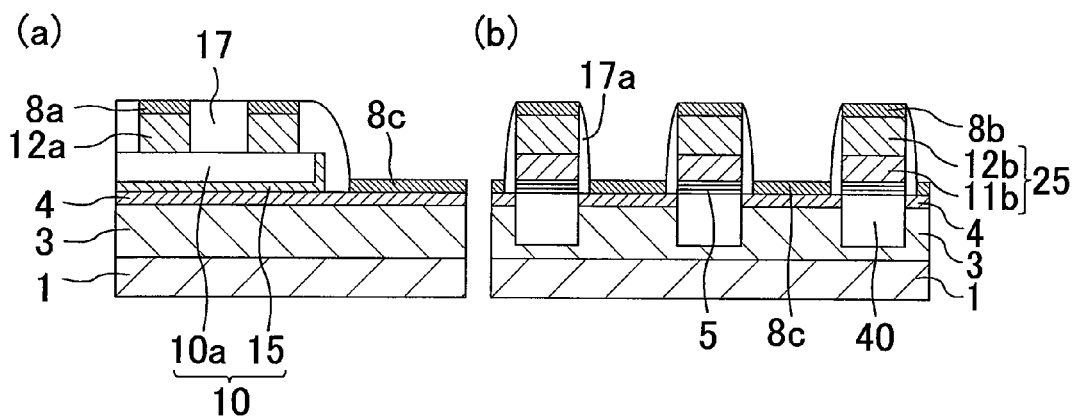
FIG. 14 is a cross-sectional view showing a fabrication step of the non-volatile semiconductor memory device of the first embodiment.

Next, as shown in (a) and (b) of FIG. 14, in order to reduce contact resistances between the word line 62, the bit line 4 and the bit line contact region 63, and respective contacts which will be formed later, a metal film such as a nickel film or the like is deposited on the substrate including exposed portions of the second polycrystal silicon films 12a and 12b and the well 3, and an upper portion of the substrate is subjected to a rapid thermal treatment to form, in a self-aligned manner, the silicide layer 8a made of nickel silicide on the second polycrystal silicon film 12a, the silicide layer 8b made of nickel silicide on the second polycrystal silicon film 12b, and the silicide layer 8c made of nickel silicide on the well 3 in the bit line contact region 63.

Figure 15:
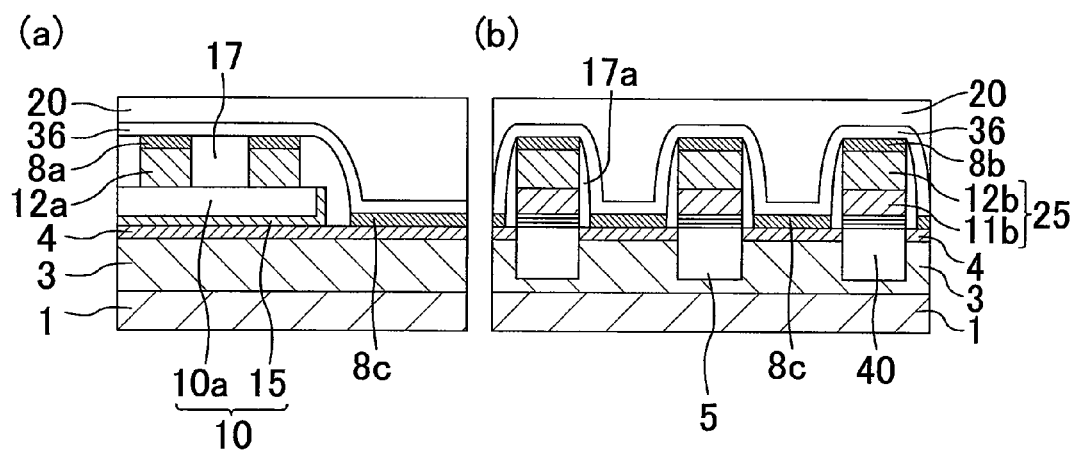
FIG. 15 is a cross-sectional view showing a fabrication step of the non-volatile semiconductor memory device of the first embodiment.

Next, as shown in (a) and (b) of FIG. 15, the liner film 36 made of silicon nitride having a thickness of about 20 nm is formed on an entire upper surface of the substrate, and thereafter, the first interlayer insulating film 20 having a thickness of about 300 nm is formed on the liner film 36. Next, an upper surface of the first interlayer insulating film 20 is planarized by polishing the first interlayer insulating film 20 by CMP.

Figure 16:
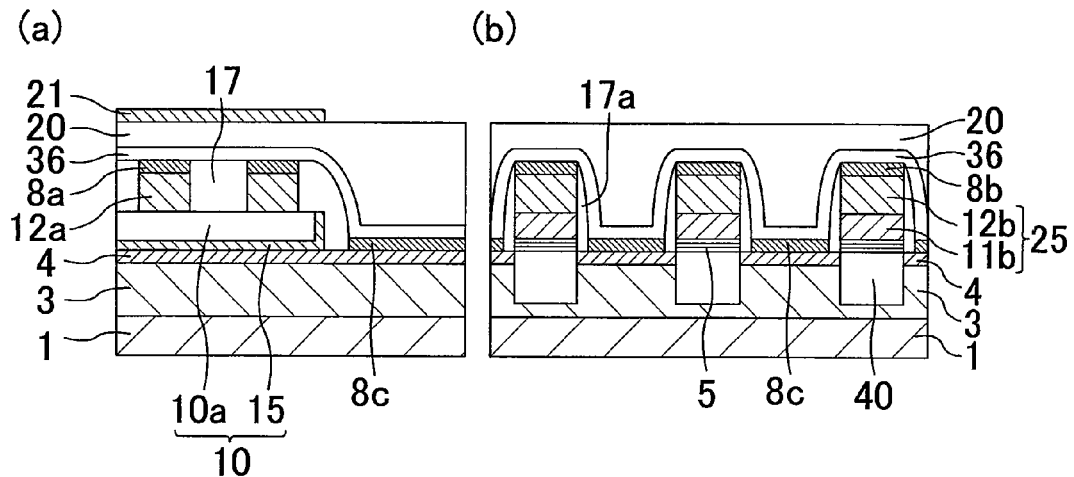
FIG. 16 is a cross-sectional view showing a fabrication step of the non-volatile semiconductor memory device of the first embodiment.

Next, as shown in (a) and (b) of FIG. 16, for example, an amorphous silicon film having a thickness of about 100 nm is formed on an entire surface of the substrate by low pressure CVD, and thereafter, a resist film (not shown) having a predetermined pattern is formed, covering at least the memory cell region. Next, the resist film is used as a mask to etch the amorphous silicon film. As a result, the second UV light shielding film 21 covering the memory cell region is formed.

Figure 17:
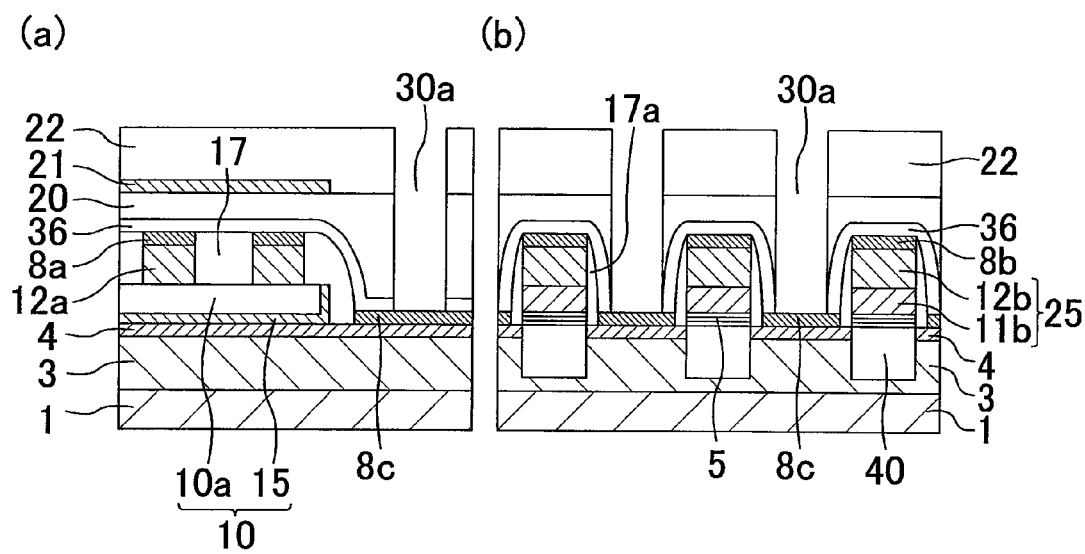
FIG. 17 is a cross-sectional view showing a fabrication step of the non-volatile semiconductor memory device of the first embodiment.

Next, as shown in (a) and (b) of FIG. 17, the second interlayer insulating film 22 made of silicon oxide is formed on the second UV light shielding film 21 and the first interlayer insulating film 20. Thereafter, contact holes 30a which penetrate through the first and second interlayer insulating films 20 and 22 to expose the silicide layer 8c are formed on portions of the bit lines 4 which are formed in the bit line contact region 63.

Figure 18:
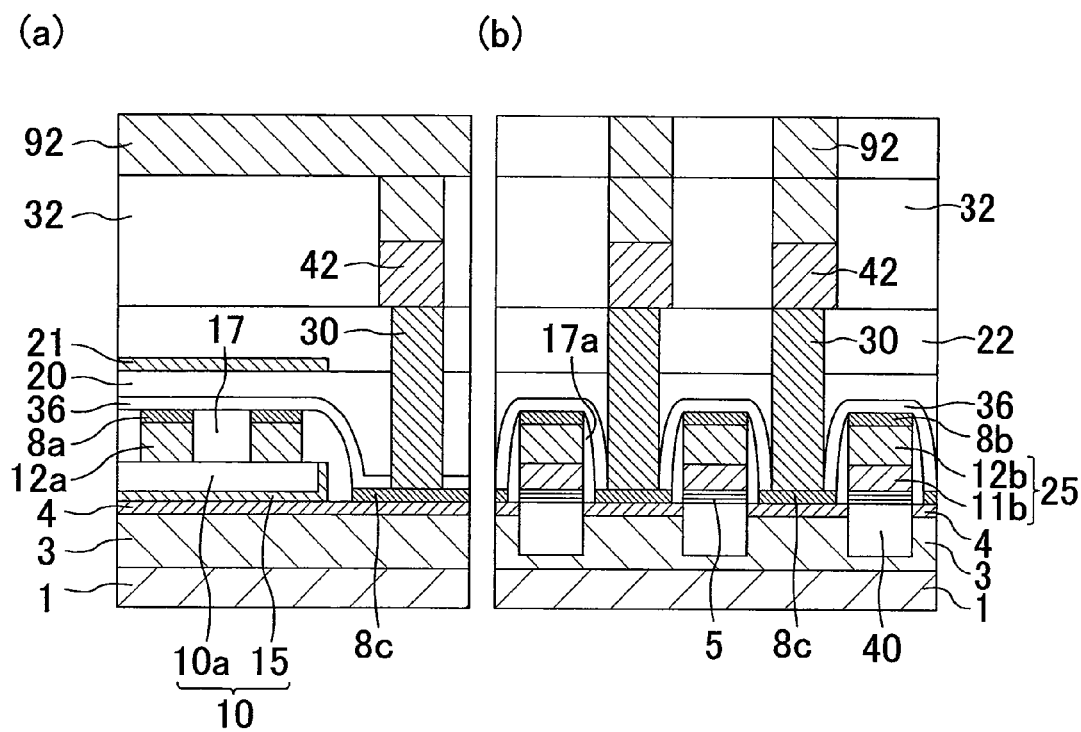
FIG. 18 is a cross-sectional view showing a fabrication step of the non-volatile semiconductor memory device of the first embodiment.

Next, as shown in (a) and (b) of FIG. 18, for example, the contact holes 30a are filled with a metal, such as tungsten or the like, to form the bit line contacts 30 which are connected via the silicide layer 8c to the bit lines 4. Thereafter, a third interlayer insulating film 32 and metal wirings 42 and 92 are successively formed by a known technique. In this case, the first-layer metal wirings 42 are formed by a single damascene technique, and the metal wirings 92 are formed by, for example, a dual damascene technique. By the aforementioned method, the non-volatile semiconductor memory device of this embodiment can be fabricated.

As described above, the non-volatile semiconductor memory device of this embodiment includes the second UV light shielding film 21 covering at least the memory cell region (the semiconductor substrate, the ONO film 5 and the like in the memory cell region), and in addition, the first UV light shielding film 25 covering the isolation insulating film 40 in the bit line contact region 63 on which the second UV light shielding film 21 is not provided. Therefore, UV light passing through the opening portion of the second UV light shielding film 21 can be effectively reduced or blocked by the first UV light shielding film 25, whereby UV light entering the memory cell region can be more reliably reduced, in addition to the light shielding effect of the second UV light shielding film 21. As a result, electrons excited by UV light can be reduced, whereby electrons trapped by the ONO film 5 can be reduced.

Moreover, the first UV light shielding film 25 covering at least the isolation insulating film 40 in the bit line contact region 63 is provided, and the liner film 36 having a high etch ratio with respect to the first interlayer insulating film 20 is provided on the side and upper surfaces of the first UV light shielding film 25, whereby the contact holes 30a for the bit line contacts 30 can be formed in a self-aligned manner. Therefore, even if the bit line contacts 30 are deviated from the desired positions in the silicon substrate (the well 3) during the formation, the bit line contacts 30 and the bit lines 4 can be stably electrically connected to each other. Therefore, a margin between the bit line contact and an edge (STI edge) of the isolation insulating film 40 to reduce or prevent overlapping between them can be reduced, and therefore, the bit line pitch can be reduced. As a result, a non-volatile semiconductor memory device having a smaller memory cell size can be stably achieved without a reduction in the reliability. In this case, a distance between the first UV light shielding film 25 and the bit line contact 30 can be caused to be smaller than a distance between the second UV light shielding film 21 and the bit line contact 30. This is because the first UV light shielding film 25 and the bit line contact 30 are both formed in a fine layer, and the second UV light shielding film 21 is formed in a rough layer, and therefore, a margin between the first UV light shielding film 25 and the bit line contact 30 can be reduced by matching of a stepper. In other words, the second UV light shielding film 21 has a large pattern size so as to cover the memory cell region, resulting in rough pattern precision. In contrast to this, the first UV light shielding film 25 is provided in the same layer in which the word lines are provided, and therefore, pattern precision is high, whereby the margin between the first UV light shielding film 25 and the bit line contact 30 can be reduced.

Note that the first UV light shielding film 25 can be formed in the same step in which the word lines 62 are formed, and therefore, the number of steps does not increase.

Figure 19A:
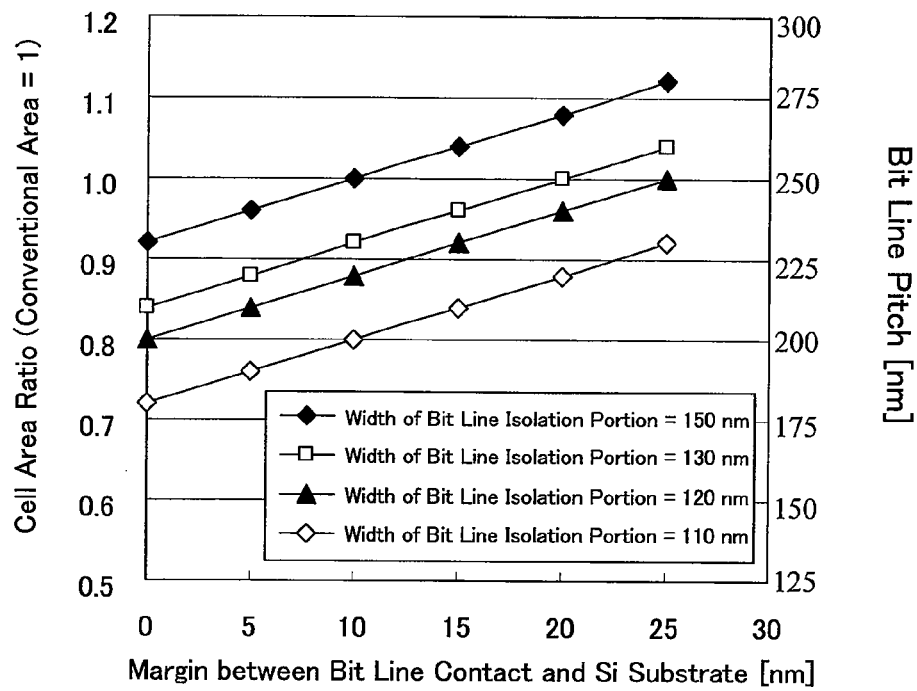
FIG. 19A is a diagram showing a relationship between a margin between a bit line contact and an STI edge, and the area of a memory cell, when contacts are formed in a self-aligned manner.

FIG. 19A is a diagram showing a relationship between the margin between the bit line contact 30 and the STI edge, and the area of the memory cell, when the contacts are formed in a self-aligned manner. In FIG. 19A, the horizontal axis represents the margin between the bit line contact 30 and the STI edge, and the vertical axis represents the cell area, where the area of a memory cell having a conventional constitution is assumed to be one. Note that the pitch of word lines is assumed to be constant in FIG. 19A.

Figure 19B:
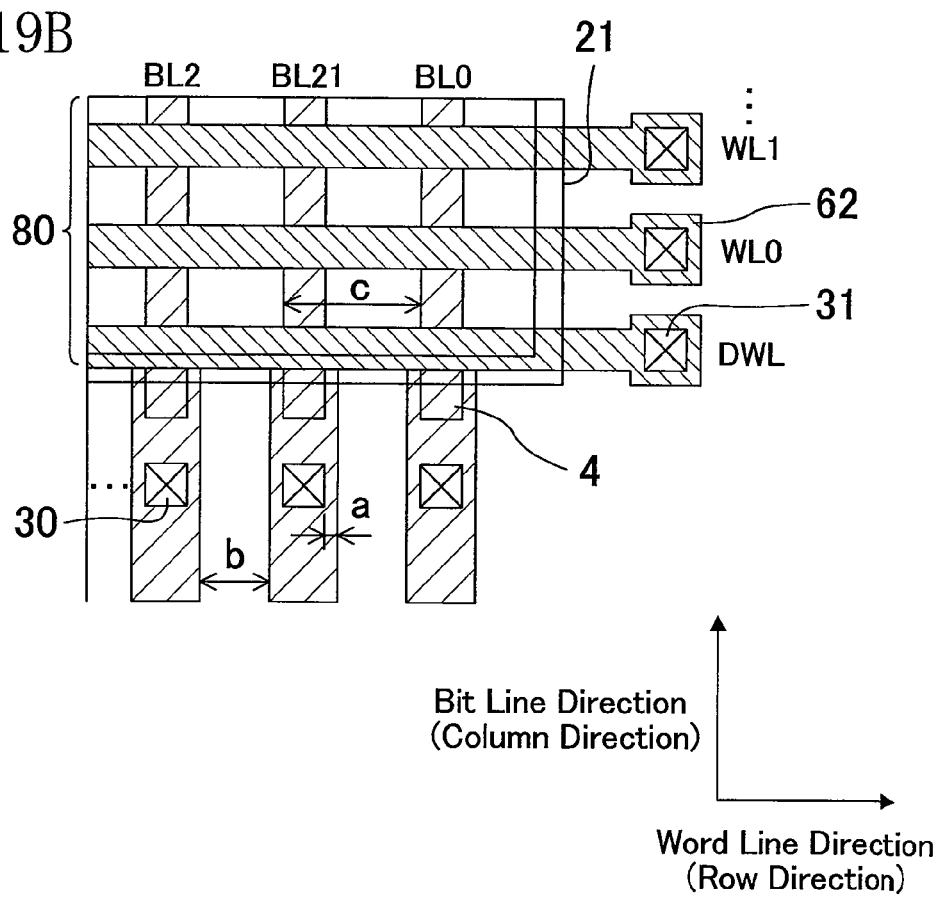
FIG. 19B is a plan view of the non-volatile semiconductor memory device of the first embodiment, where variables used to show the result of FIG. 19A are shown.

FIG. 19B is a plan view of the non-volatile semiconductor memory device. In FIG. 19B, the reference character "a" indicates the margin between the bit line contact silicon and the STI edge, the reference character "b" indicates the width of the bit line isolation portion (the interval between bit lines 4 in the bit line contact region 63, and the reference character "c" indicates a bit line pitch (the pitch of the bit lines 4 in the memory cell region), which are the variables in FIG. 19A.

As can be seen from FIG. 19A, for example, when the width of the bit line isolation portion is assumed to be 120 nm in an example non-volatile semiconductor memory device according to this embodiment, then if the margin "a" between the bit line contact and the STI edge is reduced to zero, the area ratio is 0.8 as compared to when the margin between the bit line contact and the STI edge is 25 nm in a conventional non-volatile semiconductor memory device. Thus, the cell area can be reduced by 20% by only reducing the dimension in the bit line direction. The margin between the bit line contact and the STI edge can be actually reduced to zero because the liner film 36 functions as a stopper film.

Moreover, the first UV light shielding film 25 is provided to cover the isolation insulating film 40 in the bit line contact region 63. Therefore, at least the ONO film 5 is provided on the isolation insulating film 40, whereby the STI edge is protected. Therefore, it is possible to reduce or prevent etching of the isolation insulating film 40 by wet etching or the like, whereby the occurrence of junction leakage can be reduced in the STI edge portion and the like.

Second Embodiment

Figure 20:
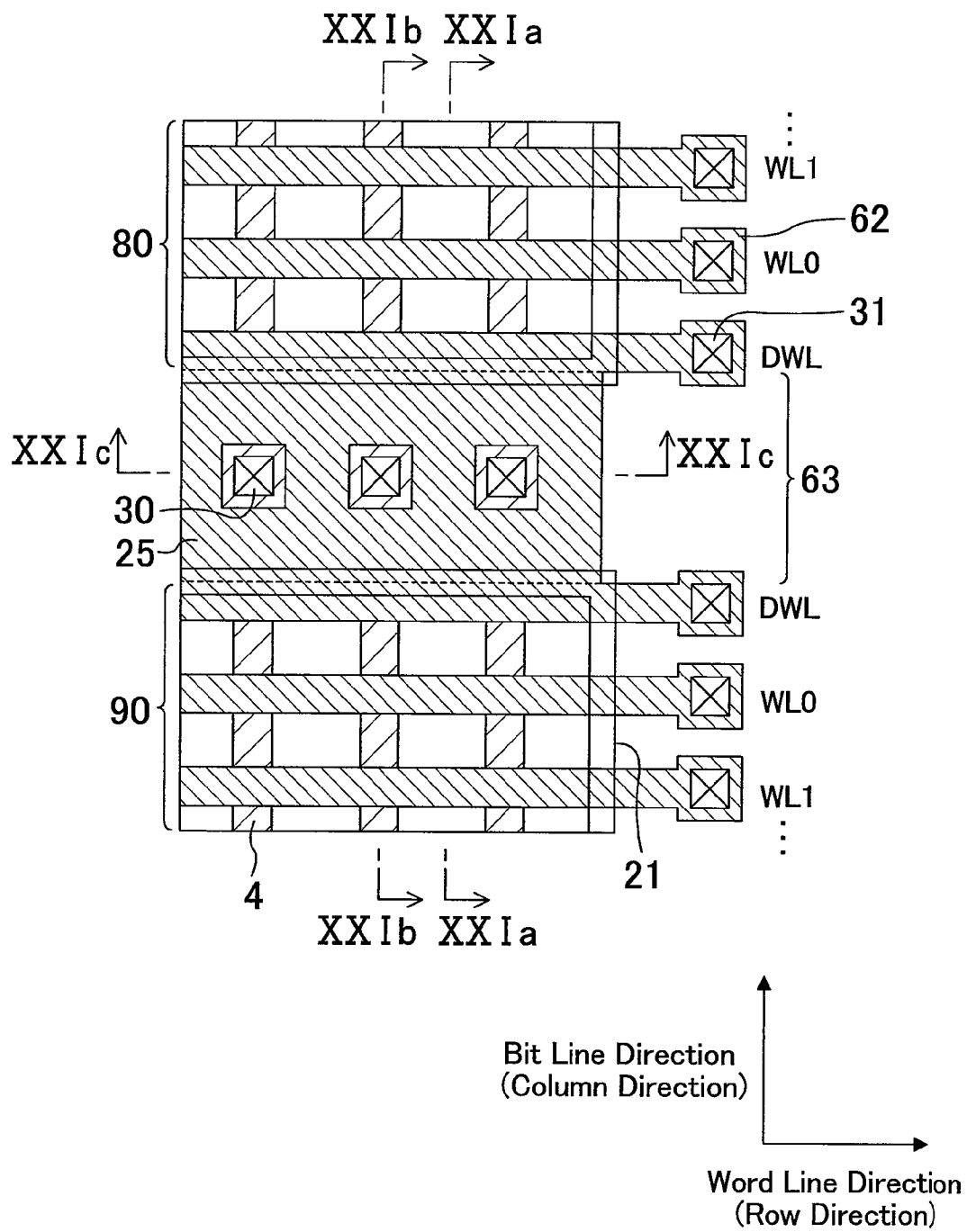
FIG. 20 is a plan view showing a layout of a non-volatile semiconductor memory device according to a second embodiment of the present disclosure.
Figure 21A:
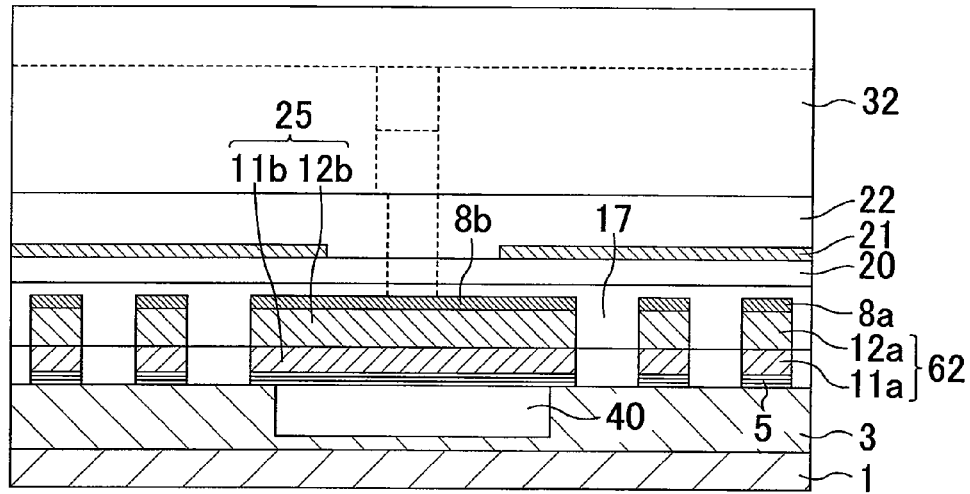
FIGS. 21A, 21B and 21C are cross-sectional views of the non-volatile semiconductor memory device of the second embodiment, taken along lines XXIa-XXIa, XXIb-XXIb and XXIc-XXIc of FIG. 20, respectively.
Figure 21B:
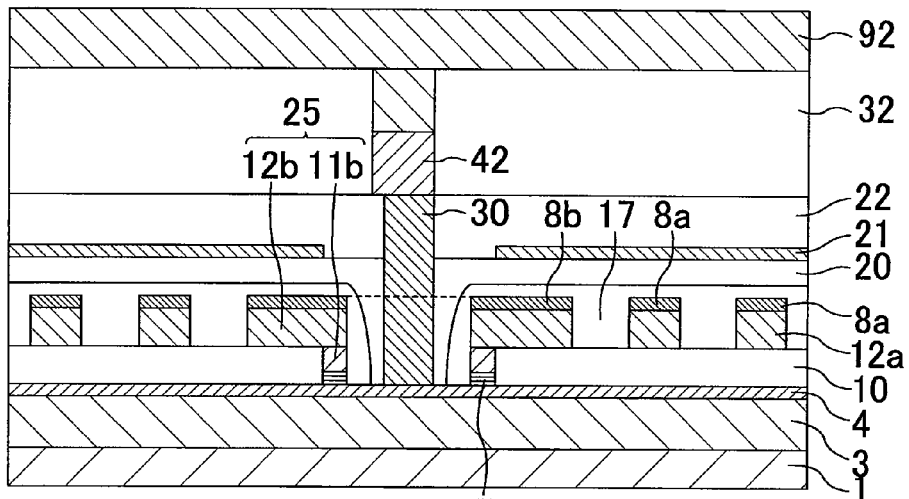
Figure 21C:
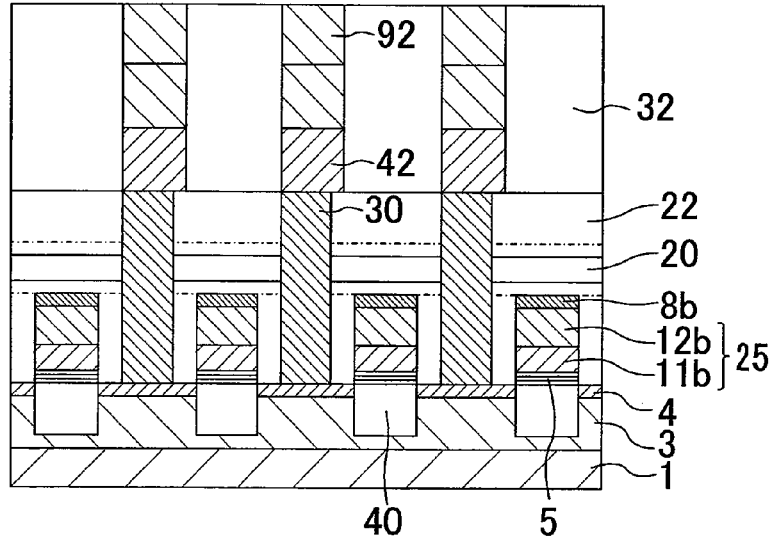

FIG. 20 is a plan view showing a layout of a non-volatile semiconductor memory device according to a second embodiment of the present disclosure. FIGS. 21A, 21B and 21C are cross-sectional views of the non-volatile semiconductor memory device, taken along lines XXIa-XXIa, XXIb-XXIb and XXIc-XXIc of FIG. 20, respectively.

As shown in FIG. 20, the non-volatile semiconductor memory device of this embodiment has a memory cell region including a plurality of bit lines 4 which are arranged at a predetermined pitch, and a plurality of word lines 62 which are arranged at a predetermined pitch, intersecting the bit lines 4. In FIG. 20, a first memory cell region 80, a second memory cell region 90, and a bit line contact region 63 provided between the first and second memory cell regions 80 and 90, are shown. In each of the first and second memory cell regions 80 and 90, the word lines 62 of FIG. 20 are also indicated by WL0, WL1 and so on in order of increasing distance from the bit line contact region 63.

The bit lines 4 are formed in an upper portion of a semiconductor substrate of, for example, a first conductivity type (e.g., p type), and are formed of a diffusion layer of a second conductivity type (e.g., n type). As used herein, the term "semiconductor substrate" refers to a combination of a substrate 1 made of silicon or the like, and a well 3 of the first conductivity type provided on the substrate 1. The bit lines 4 are extended to the bit line contact region 63, and are connected to respective corresponding bit line contacts 30 in the bit line contact region 63.

A word line contact 31 is provided at a terminal portion of each word line 62. A dummy word line (DWL) extending in a word line direction is provided on a portion of each memory cell region close to the bit line contact region 63.

The bit line contacts 30 are surrounded by the first UV light shielding film 25 both in the word line direction and in the bit line direction while a margin is provided between at least the contacts and the first UV light shielding film 25 to reduce or prevent overlapping between them. Therefore, the first UV light shielding film 25 covers the bit line contact region 63 excluding the bit line contacts 30 and their peripheries. Moreover, the first UV light shielding film 25 is connected and integrated with the dummy word lines (DWL).

As shown in FIGS. 21A-21C, the first and second memory cell regions 80 and 90 and the bit line contact region 63 are formed on the well 3 provided on the substrate 1 of the first conductivity type.

In the bit line contact region 63, any two adjacent bit lines 4 are electrically separated from each other by an insulating film (bit line isolation portion) 40 for isolation (e.g., shallow trench isolation (STI), etc.) which is provided on the well 3.

In the first and second memory cell regions 80 and 90, an ONO film 5 is provided in a region which is interposed between the well 3 and the word lines 62 and is located between any two bit lines 4 (see FIGS. 21A and 21C). The ONO film 5 is also provided on the isolation insulating film 40 in the bit line contact region 63.

The word lines 62 are formed of a first polycrystal silicon film 11a provided on the ONO film 5, and a second polycrystal silicon film 12a provided on the first polycrystal silicon film 11a and a bit line oxide film 10. The word lines 62 (the second polycrystal silicon film 12a) are electrically separated from the bit lines 4 by the bit line oxide film 10.

As shown in FIGS. 20 and 21A, the non-volatile semiconductor memory device of this embodiment is different from the non-volatile semiconductor memory device of the first embodiment in that the dummy word lines DWL and the first UV light shielding film 25 are integrated together as described above. In the dummy word lines DWL and the first UV light shielding film 25, the first and second polycrystal silicon films 11b and 12b are stacked. The first polycrystal silicon film 11b and the first polycrystal silicon film 11a have the same thickness, which is, for example, about 50 nm. The second polycrystal silicon film 12b and the second polycrystal silicon film 12a have the same thickness, which is, for example, about 150 nm. Note that, as in the non-volatile semiconductor memory device of the first embodiment, the first UV light shielding film 25 is formed to cover at least the isolation insulating film 40 in the bit line contact region 63. The first UV light shielding film 25 is also located to cover at least a terminal portion of the bit line oxide film 10.

A silicide layer 8a is provided on the word lines 62 so as to reduce the resistance of the word lines 62. When the first UV light shielding film 25 and the word lines 62 are formed in the same step, a silicide layer 8b is also formed on the first UV light shielding film 25. A silicon oxide film 17 is provided to fill gaps in the second polycrystal silicon film 12a, and is also provided on the silicide layer 8a and a portion of the silicide layer 8b.

A first interlayer insulating film 20 is formed on the silicon oxide film 17 and the silicide layer 8b. A second UV light shielding film 21 is formed on the first interlayer insulating film 20, covering at least the semiconductor substrate, the ONO film 5 and the like in the memory cell region. A second interlayer insulating film 22 is formed on the second UV light shielding film 21 and the first interlayer insulating film 20.

In the bit line contact region 63, bit line contacts 30 are provided which penetrate the first and second interlayer insulating films 20 and 22 and each of which has an end connected to the corresponding bit line 4. The other end of each bit line contact 30 is electrically connected to a metal wiring 92 on the second interlayer insulating film 22. Note that a silicide layer does not have to be provided between the bit lines 4 and the bit line contacts 30.

In the non-volatile semiconductor memory device of this embodiment, the first UV light shielding film 25 is provided to cover at least the isolation insulating film 40 which is a bit line isolation portion in the bit line contact region 63, and cover the terminal portion of the bit line oxide film 10. Therefore, the second UV light shielding film 21 covering at least the memory cell region prevents most of UV light which is generated by the plasma process during fabrication and then enters the memory cell region to affect the memory cell region.

Moreover, even if UV light enters through the opening portion of the second UV light shielding film 21 in the bit line contact region 63, the first UV light shielding film 25 reduces or blocks the UV light, and therefore, the influence of UV light generated during fabrication can be reduced as compared to conventional devices. Moreover, the first UV light shielding film 25 is also provided over the bit lines 4 in the bit line contact region 63, and therefore, UV light entering the memory cell region can be more reliably reduced than in the non-volatile semiconductor memory device of the first embodiment. Therefore, electrons which are excited by UV light and are then trapped in the ONO film 5 can be more effectively reduced or prevented, and therefore, the threshold voltages of the memory cells can be caused to be more uniform in the entire memory cell region.

Note that the ONO film 5 is interposed between the first UV light shielding film 25 and the bit lines 4 in the bit line contact region 63, and therefore, there is not conduction between the first UV light shielding film 25 and the bit lines 4.

In the non-volatile semiconductor memory device of this embodiment, a liner film made of silicon nitride may be provided between the silicon oxide film 17 and the first interlayer insulating film 20.

Third Embodiment

Figure 22A:
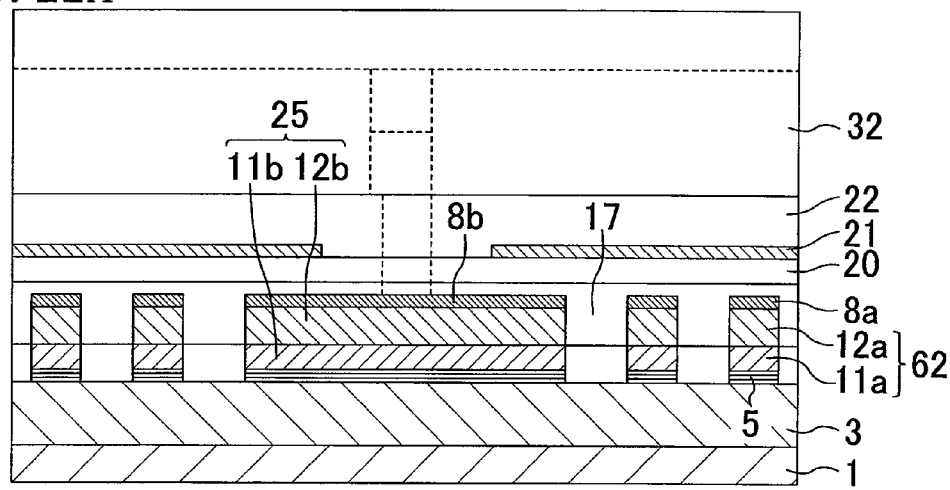
FIGS. 22A-22C are cross-sectional views of a non-volatile semiconductor memory device according to a third embodiment of the present disclosure.
Figure 22B:
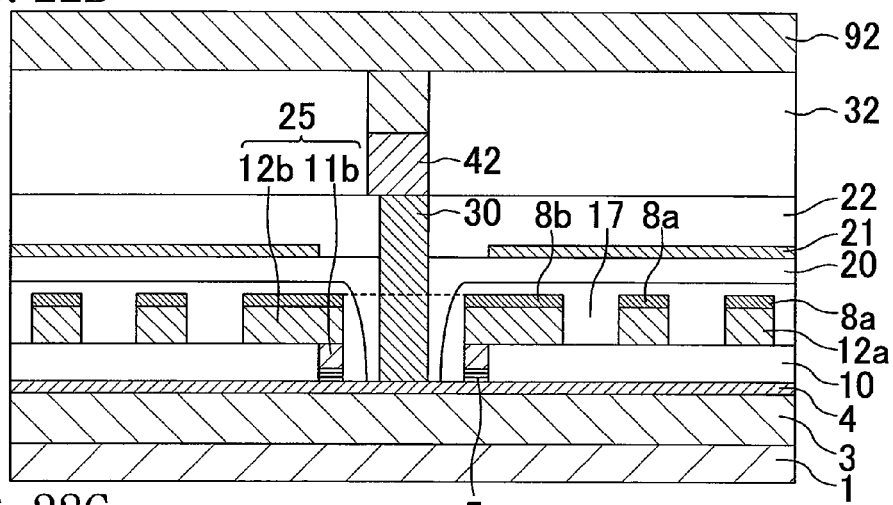
Figure 22C:
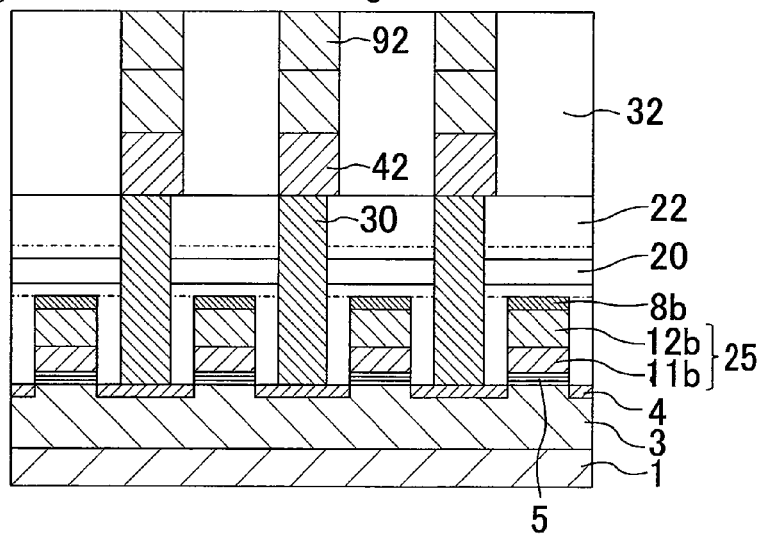
Figure 23:
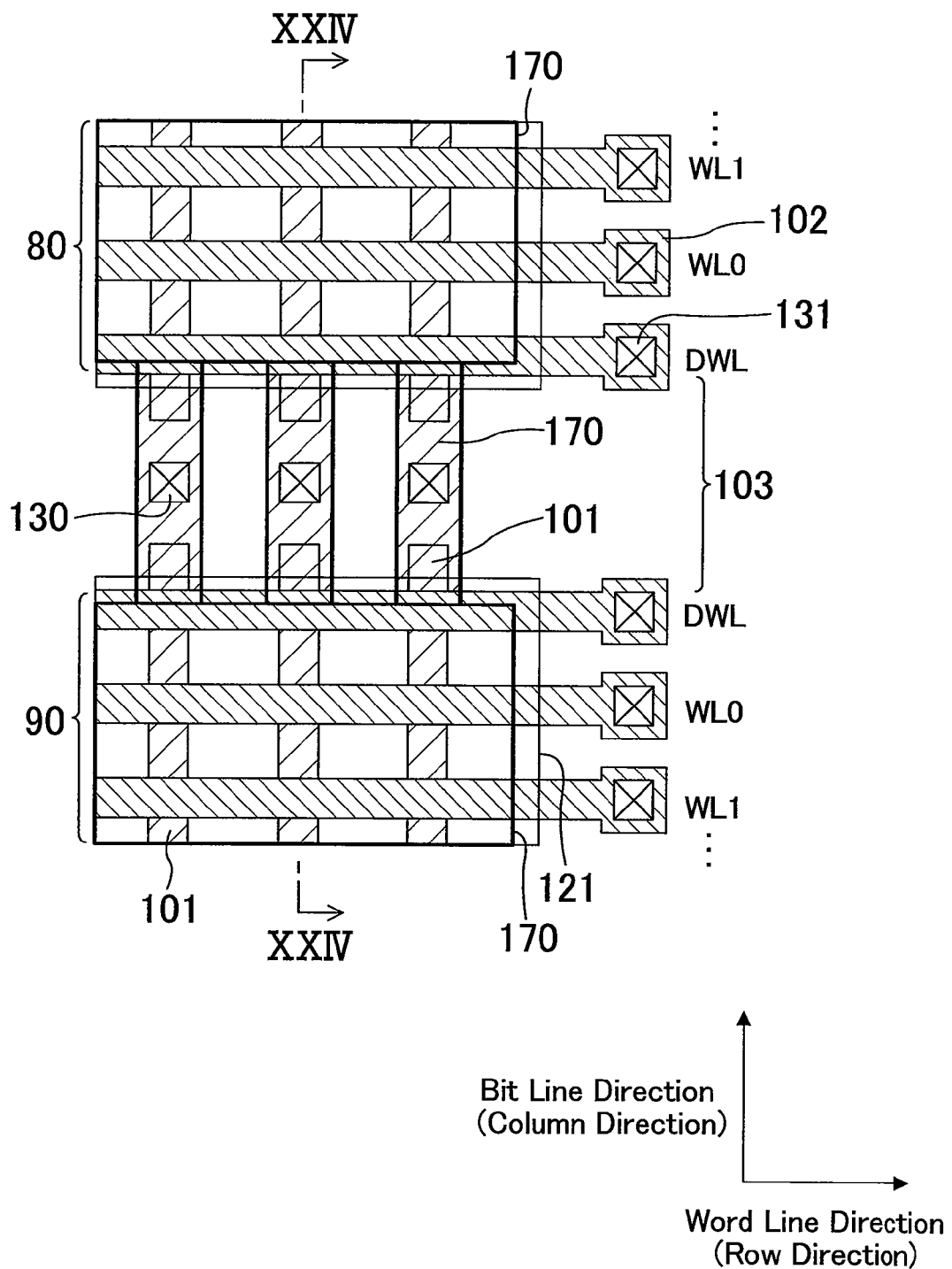
FIG. 23 is a plan view showing a layout of a conventional non-volatile semiconductor memory device.
Figure 24:
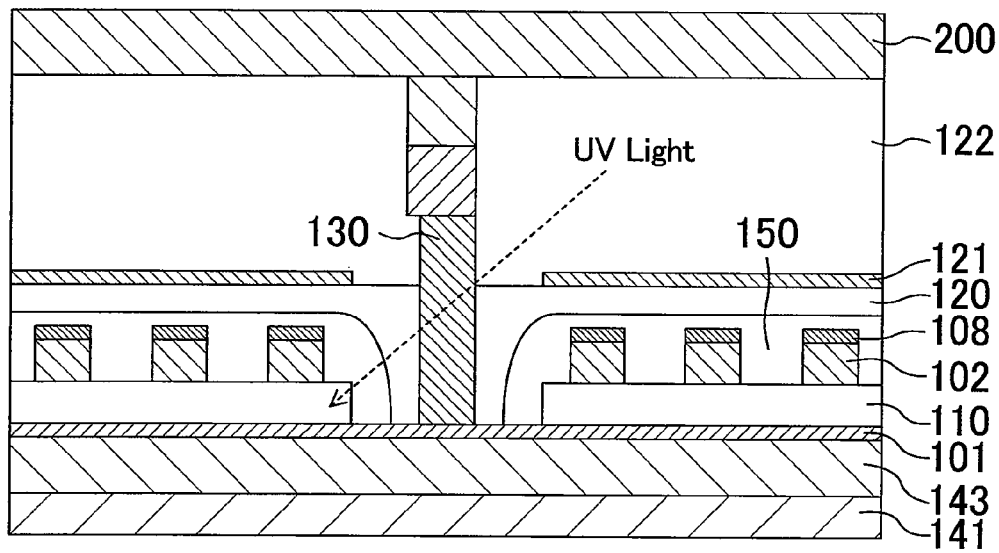
FIG. 24 is a cross-sectional view of the conventional non-volatile semiconductor memory device, taken along line XXIV-XXIV of FIG. 23.
Figure 25:
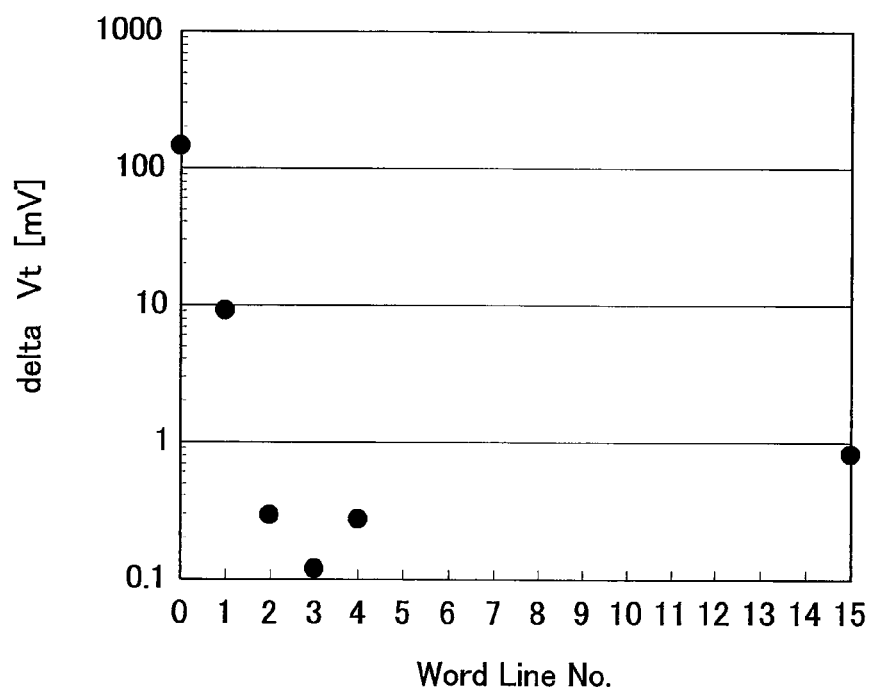
FIG. 25 is a diagram showing a relationship between the positions of word lines as viewed from a bit line contact and the threshold voltages (Vt) of memory cells in a bit line direction.

FIGS. 22A-22C are cross-sectional views of a non-volatile semiconductor memory device according to a third embodiment of the present disclosure. The non-volatile semiconductor memory device of this embodiment has a plan view almost similar to that of the non-volatile semiconductor memory device of the second embodiment of FIG. 20. FIGS. 22A, 22B and 22C are cross-sectional views of the non-volatile semiconductor memory device of this embodiment, taken along lines corresponding to lines XXIa-XXIa, XXIb-XXIb and XXIc-XXIc of FIG. 20, respectively.

As shown in FIGS. 22A-22C, the non-volatile semiconductor memory device of this embodiment includes a semiconductor substrate of a first conductivity type (e.g., p type), and a well 3 of the first conductivity type formed in an upper portion of the semiconductor substrate.

In the non-volatile semiconductor memory device of this embodiment, a bit line isolation portion for separating any two adjacent bit lines 4 in a bit line contact region 63 is not formed of an isolation insulating film 40, and is constructed by a gate isolation structure including a first UV light shielding film 25 which are connected to dummy word lines DWL, and an ONO film 5 which is provided below the first UV light shielding film 25. In this point, the non-volatile semiconductor memory device of this embodiment is different from the non-volatile semiconductor memory devices of the first and second embodiments. More specifically, any two adjacent bit lines 4 in the bit line contact region 63 (see FIG. 22C) are electrically separated from each other by the dummy word lines DWL and the first UV light shielding film 25, which are maintained at a low potential of, for example, about 0 V.

As in the non-volatile semiconductor memory device of the second embodiment, bit line contacts 30 are surrounded by the first UV light shielding film 25 both in the word line direction and in the bit line direction while a margin is provided between at least the contacts and the first UV light shielding film 25 to reduce or prevent overlapping between them. The first UV light shielding film 25 is connected and integrated with the dummy word lines DWL.

Word lines 62 are formed of a first polycrystal silicon film 11a provided on the ONO film 5, and a second polycrystal silicon film 12a provided on the first polycrystal silicon film 11a and a bit line oxide film 10. The word lines 62 (the second polycrystal silicon film 12a) are electrically separated from the bit lines 4 by the bit line oxide film 10.

In the dummy word lines DWL and the first UV light shielding film 25, a first polycrystal silicon film 11b and a second polycrystal silicon film 12b are stacked. The first polycrystal silicon film 11b and the first polycrystal silicon film 11a have the same thickness, which is, for example, about 50 nm. The second polycrystal silicon film 12b and the second polycrystal silicon film 12a have the same thickness, which is, for example, about 150 nm. Note that, as in the non-volatile semiconductor memory device of the first embodiment, the first UV light shielding film 25 is formed to cover at least the isolation insulating film 40 in the bit line contact region 63. The first UV light shielding film 25 is also located to cover at least a terminal portion of the bit line oxide film 10.

A silicide layer 8a is provided on the word lines 62 so as to reduce the resistance of the word lines 62. When the first UV light shielding film 25 and the word lines 62 are formed in the same step, a silicide layer 8b is also formed on the first UV light shielding film 25. A silicon oxide film 17 is provided to fill gaps in the second polycrystal silicon film 12a, and is also provided on the silicide layer 8a and a portion of the silicide layer 8b.

A first interlayer insulating film 20 is formed on the silicon oxide film 17 and the silicide layer 8b. A second UV light shielding film 21 is formed on the first interlayer insulating film 20, covering at least the semiconductor substrate, the ONO film 5 and the like in the memory cell region. A second interlayer insulating film 22 is formed on the second UV light shielding film 21 and the first interlayer insulating film 20.

With the aforementioned structure, the second UV light shielding film 21 covering at least the components in the memory cell region prevents most of UV light which is generated by the plasma process during fabrication and then enters the memory cell region to affect the memory cell region.

Moreover, even if UV light enters through the opening portion of the second UV light shielding film 21 in the bit line contact region 63, the first UV light shielding film 25 reduces or blocks the UV light, and therefore, the influence of UV light generated during fabrication can be reduced as compared to conventional devices. Moreover, the first UV light shielding film 25 is also provided over the bit lines 4 in the bit line contact region 63, and therefore, UV light entering the memory cell region can be more reliably reduced than in the non-volatile semiconductor memory device of the first embodiment. Therefore, electrons which are excited by UV light and are then trapped by the ONO film 5 can be more effectively reduced or prevented, and therefore, the threshold voltages of the memory cells can be caused to be more uniform in the entire memory cell region.

As described in this embodiment, any two adjacent bit lines 4 in the bit line contact region 63 can be electrically separated from each other not only by the insulating film for isolation, such as STI or the like, but also by applying a low constant potential of, for example, 0 V to the first UV light shielding film 25 and the dummy word lines DWL connected thereto.

In the non-volatile semiconductor memory device of this embodiment, the bit line isolation portion can be achieved by gate isolation. Therefore, the bit line pitch can be reduced without a limitation due to filling characteristics of STI, and therefore, a non-volatile semiconductor memory device having a smaller size can be obtained.

Although a silicide layer is formed in a predetermined region on the second polycrystal silicon films 12a and 12b or the well 3 in the non-volatile semiconductor memory devices of the first to third embodiments, the present disclosure is not limited to this. For example, a metal layer may be formed instead of the silicide layer.

As described above, the non-volatile semiconductor memory devices according to the examples of the present disclosure are useful for various electronic apparatuses requiring storage operation.

In view of the many possible embodiments to which the principles of the present disclosure may be applied, it should be recognized that the illustrated embodiments are only preferred examples of the present disclosure and should not be taken as limiting the scope of the invention. Rather, the scope of the present disclosure is defined by the following claims. We therefore claim as our present disclosure all that comes within the scope and spirit of these claims.

What is claimed is:

1. A non-volatile semiconductor memory device comprising:
    a memory cell region including a plurality of bit lines formed of a diffusion layer formed in an upper portion of a semiconductor substrate, and spaced from each other and extending in a column direction, a plurality of word lines formed on the semiconductor substrate, and spaced from each other and extending in a row direction, and intersecting the plurality of bit lines, and a first insulating film interposed between the semiconductor substrate and each of the plurality of word lines and located in a region between any two adjacent ones of the plurality of bit lines, and having a function of holding electric charge;
    a bit line contact region including bit line contacts connected to the plurality of bit lines extended from the memory cell region, and a bit line isolation portion electrically separating the plurality of bit lines from each other;
    a first UV light shielding film formed on the semiconductor substrate and covering at least a portion of the bit line isolation portion or a portion of the semiconductor substrate in the bit line contact region;
    an interlayer insulating film provided on the word lines and the first UV light shielding film; and
    a second UV light shielding film formed on the interlayer insulating film and covering the semiconductor substrate in the memory cell region,
    wherein
    in the memory cell region, a plurality of memory cells are provided, each of which has a source region and a drain region which are regions where the corresponding two bit lines intersect the corresponding word line, a gate insulating film which is the first insulating film interposed between the source region and the drain region, and a gate electrode which is a portion formed on a region of the corresponding word line located on the gate insulating film.

2. The non-volatile semiconductor memory device of claim 1, wherein
    the bit line isolation portion is an STI region formed in the semiconductor substrate between each of the plurality of bit lines, and
    the first UV light shielding film is formed on at least the STI region.

3. The non-volatile semiconductor memory device of claim 2, wherein
    a second insulating film having the same constitution as that of the first insulating film is further provided in the bit line contact region, and
    in the bit line contact region, the first UV light shielding film is formed on the STI region with the second insulating film being interposed therebetween.

4. The non-volatile semiconductor memory device of claim 3, wherein
    the first UV light shielding film covers at least a portion of a region between each of the plurality of bit lines and at least a portion of each of the bit lines, in the bit line contact region.

5. The non-volatile semiconductor memory device of claim 1, wherein
    the first UV light shielding film has the same constitution as that of the gate electrode.

6. The non-volatile semiconductor memory device of claim 1, wherein
    the first UV light shielding film has the same constitution as that of the gate electrode,
    in the bit line contact region, a second insulating film having the same constitution as that of the first insulating film is further provided below the first UV light shielding film, and
    the bit line isolation portion has a gate isolation structure including the first UV light shielding film and the second insulating film.

7. The non-volatile semiconductor memory device of claim 6, wherein
    in a portion of the memory cell region close to the bit line contact region, a dummy word line having substantially the same constitution as that of the word line is provided, extending in the row direction and intersecting the plurality of bit lines, and
    the first UV light shielding film is electrically connected to the dummy word line.

8. The non-volatile semiconductor memory device of claim 7, wherein
    the first UV light shielding film and the dummy word line are connected to a ground potential.

9. The non-volatile semiconductor memory device of claim 1, further comprising:
    a bit line oxide film formed on the plurality of bit lines and electrically separating the bit lines from the word lines, wherein
    the first UV light shielding film covers at least a terminal portion of the bit line oxide film.

10. The non-volatile semiconductor memory device of claim 1, wherein
    the first UV light shielding film is a polycrystal silicon film.

11. The non-volatile semiconductor memory device of claim 1, wherein the first UV light shielding film is a multilayer film including a polycrystal silicon film and a silicide film formed on the polycrystal silicon film.

12. The non-volatile semiconductor memory device of claim 1, wherein
the first UV light shielding film is a multilayer film including a polycrystal silicon film and a metal film formed on the polycrystal silicon film.

13. The non-volatile semiconductor memory device of claim 1, further comprising:
a liner film covering at least a portion of the first UV light shielding film, formed below the interlayer insulating film, and having etching selectivity with respect to the interlayer insulating film.

14. The non-volatile semiconductor memory device of claim 13, wherein
the bit line contacts penetrate through the liner film to be connected to the respective bit lines, and
the bit line contacts are formed in a self-aligned manner by the liner film.

15. The non-volatile semiconductor memory device of claim 13, wherein
the liner film is a silicon nitride film.

* * * * *